United States Patent [19]
Arami et al.

[11] Patent Number: 5,591,269
[45] Date of Patent: Jan. 7, 1997

[54] VACUUM PROCESSING APPARATUS

[75] Inventors: Junichi Arami, Tokyo; Kenji Ishikawa, Sagamihara; Youichi Deguchi, Machida; Hironori Yagi, Yokohama; Nobuo Kawada; Isao Yanagisawa, both of Annaka, all of Japan

[73] Assignees: Tokyo Electron Limited; Tokyo Electron Tohoku Limited, both of Japan

[21] Appl. No.: 265,134

[22] Filed: Jun. 23, 1994

[30] Foreign Application Priority Data

| Jun. 24, 1993 | [JP] | Japan | 5-180851 |
| Jun. 29, 1993 | [JP] | Japan | 5-185502 |
| Jun. 29, 1993 | [JP] | Japan | 5-185503 |
| Jun. 29, 1993 | [JP] | Japan | 5-185519 |
| Sep. 28, 1993 | [JP] | Japan | 5-264412 |
| Feb. 3, 1994 | [JP] | Japan | 6-031831 |

[51] Int. Cl.$^6$ ................................. C23C 16/00
[52] U.S. Cl. .................. 118/723 R; 118/725; 118/728; 118/500
[58] Field of Search .................. 118/725, 728, 118/500, 723 R

[56] References Cited

U.S. PATENT DOCUMENTS 5,155,652 10/1992 Logan et al. .
5,275,683 1/1994 Arami et al. .

FOREIGN PATENT DOCUMENTS

| 52-67353 | 6/1977 | Japan . |
| 59-124140 | 7/1984 | Japan . |
| 63-216283 | 9/1988 | Japan . |
| 4-124076 | 4/1992 | Japan . |
| 4-358074 | 12/1992 | Japan . |
| 5-129210 | 5/1993 | Japan . |

OTHER PUBLICATIONS

08/168367, Dec. 17, 1993, Ishikawa et al.
08/187863, Jan. 28, 1994, Deguchi, et al.
08/195282, Feb. 14, 1994, Kawakami, et al.

*Primary Examiner*—Richard Bueker
*Attorney, Agent, or Firm*—Graham & James LLP

[57] ABSTRACT

A vacuum processing apparatus includes: a processing chamber for performing a film formation process to a semiconductor wafer in a vacuum; a mounting member provided in the processing chamber and having a mounting surface for mounting a target object; an electrostatic chuck, provided to the mounting surface of the mounting member, for chucking the semiconductor wafer; a heating mechanism for heating the semiconductor wafer; and a processing gas supply mechanism for supplying a processing gas for performing the film formation process to the semiconductor wafer into the processing chamber. The mounting member has a base, a first insulating layer formed on the surface of the base, and a second insulating layer formed on the first insulating layer, and has a conductive layer between the first insulating layer and the second insulating layer on the mounting surface side of the mounting member to obtain the above electrostatic chuck constituted by the first insulating layer, the second insulating layer, and the conductive layer, and the heating mechanism has a heating member provided between the first insulating layer and the second insulating layer on the lower surface side of the mounting member.

18 Claims, 19 Drawing Sheets

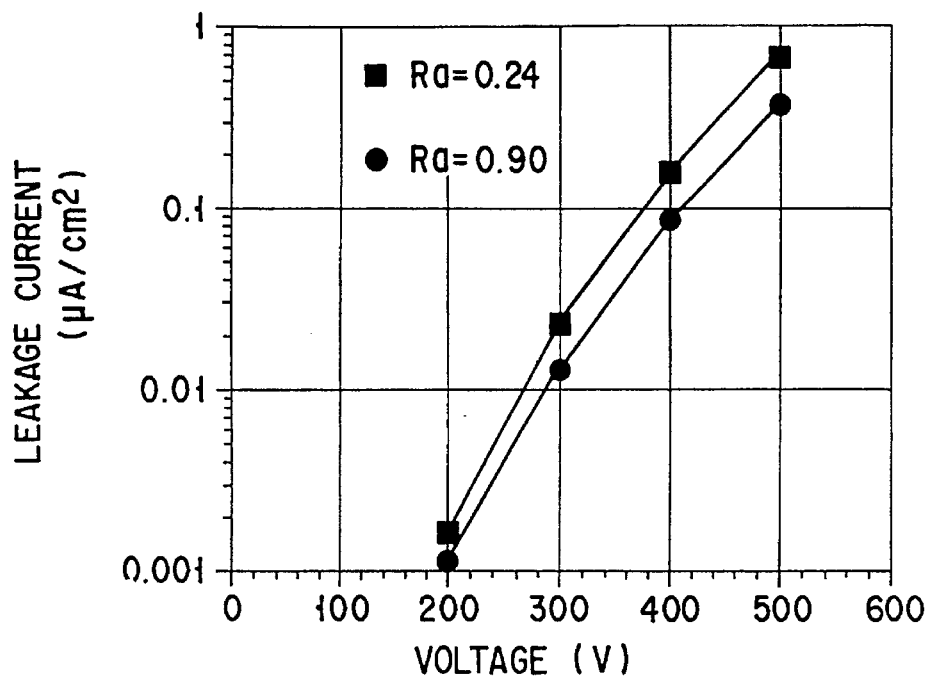
F I G. 10
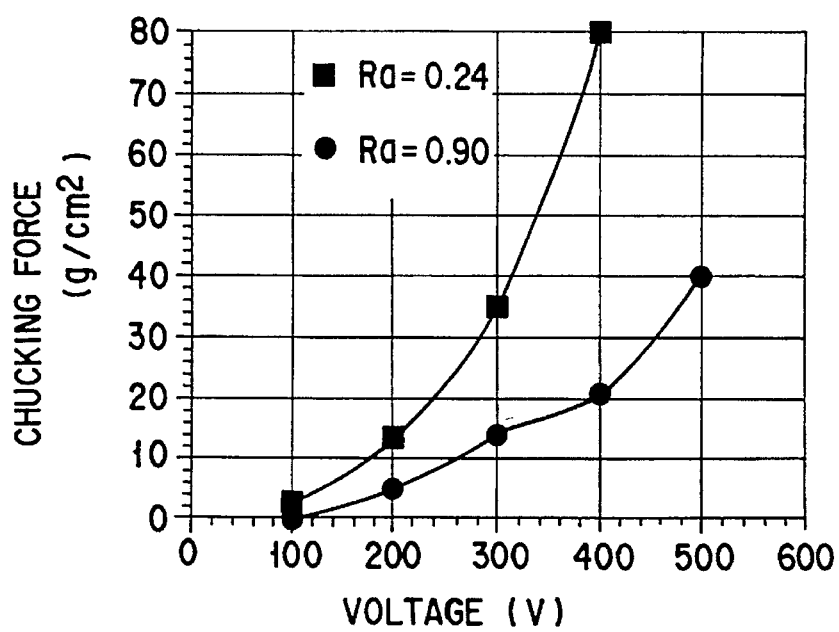
F I G. 11

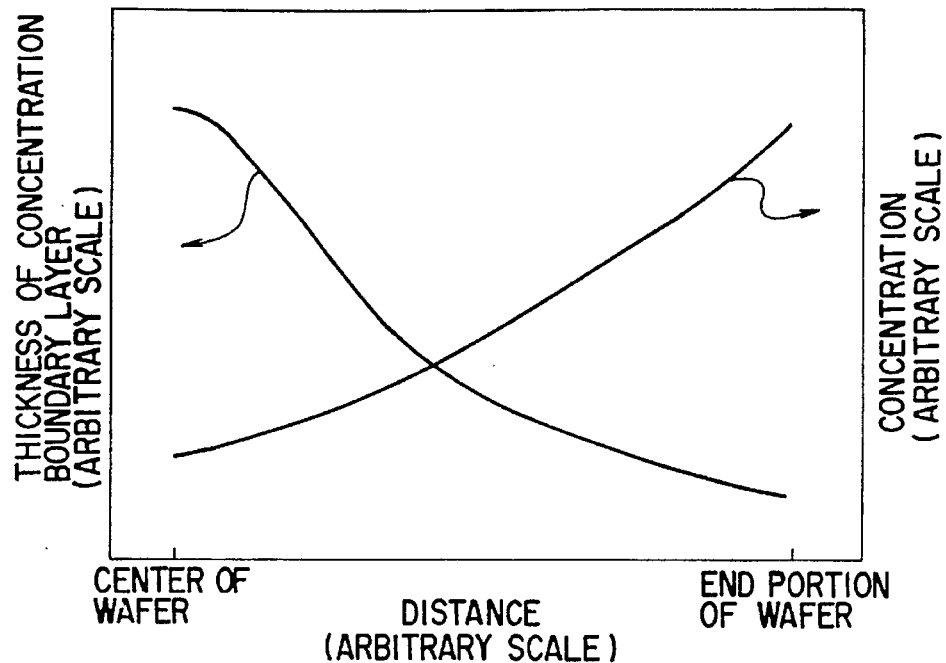
F I G. 21
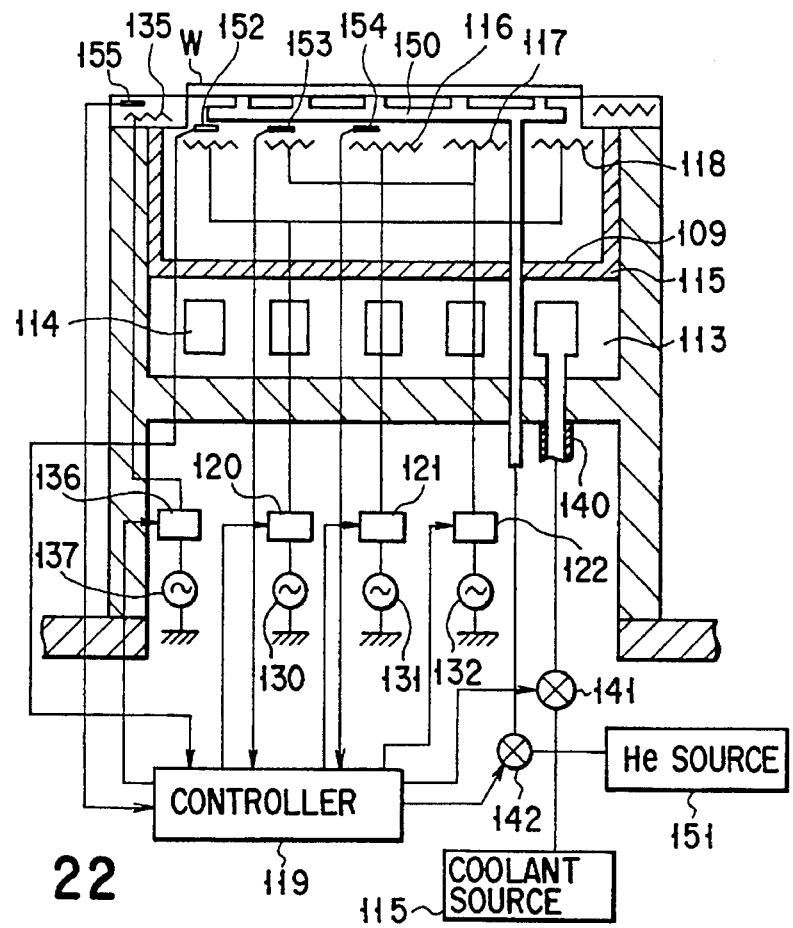
F I G. 22

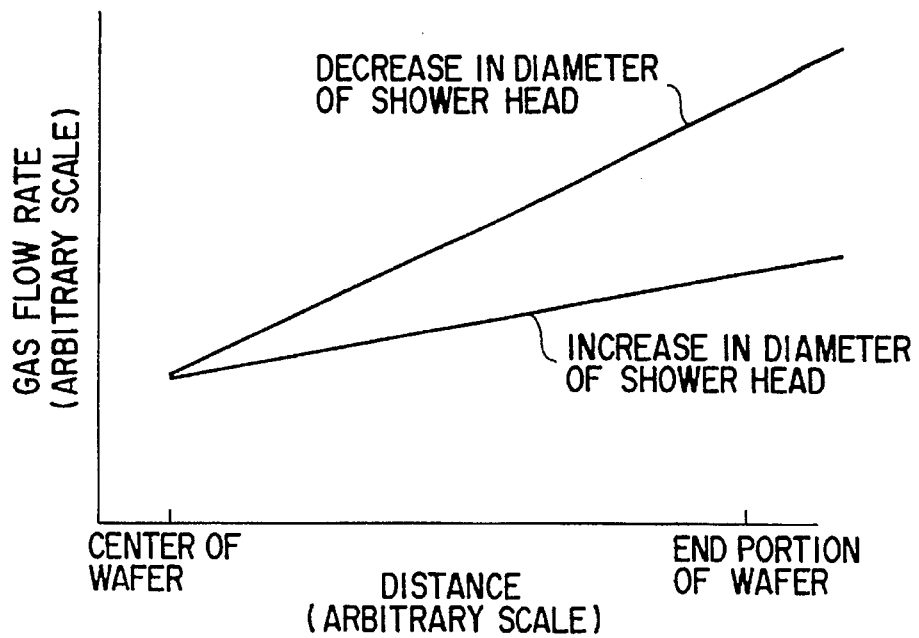
F I G. 26
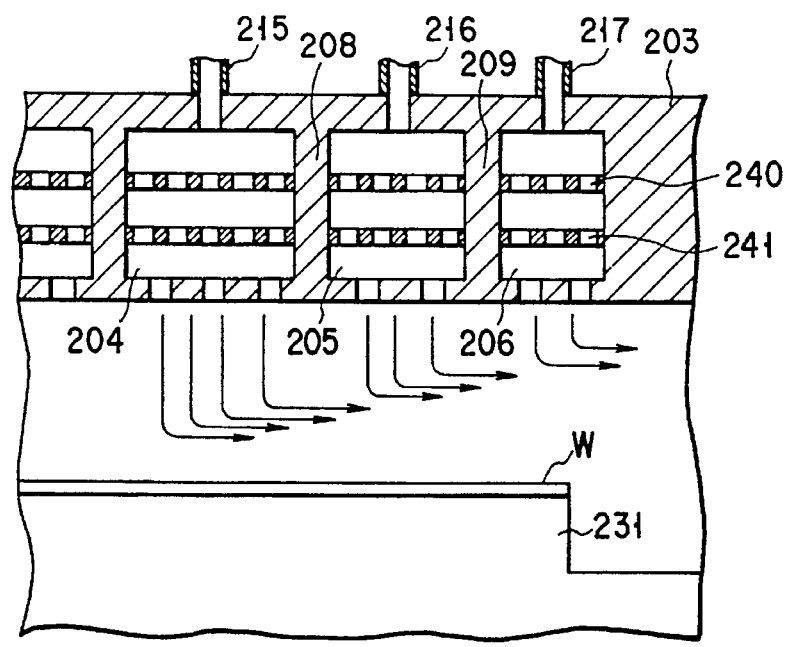
F I G. 27

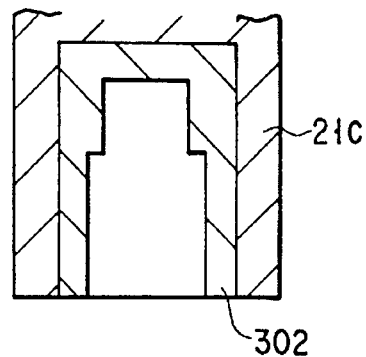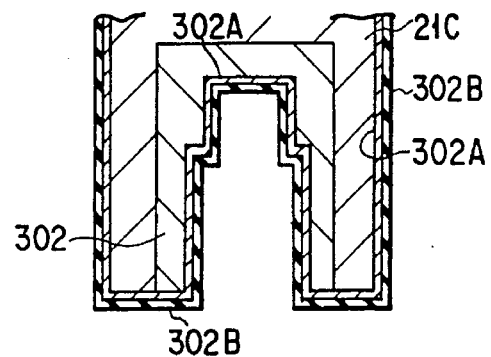
F I G. 31A    F I G. 31B
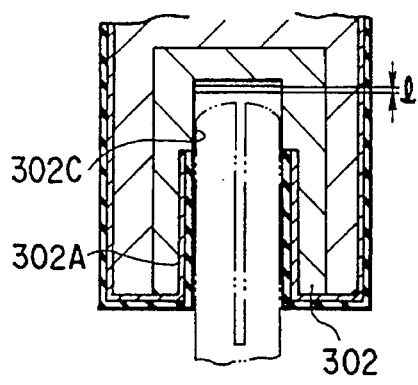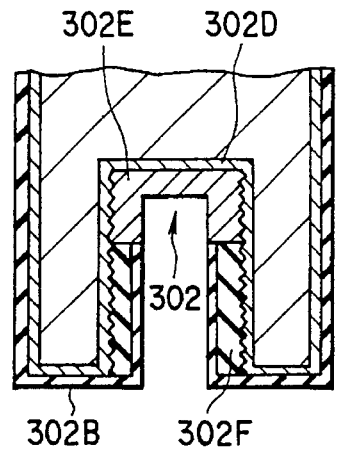
F I G. 31C    F I G. 32
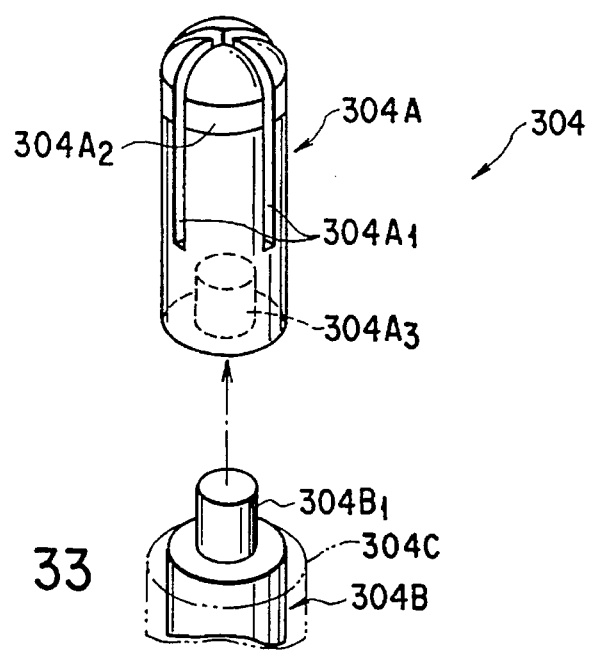
F I G. 33

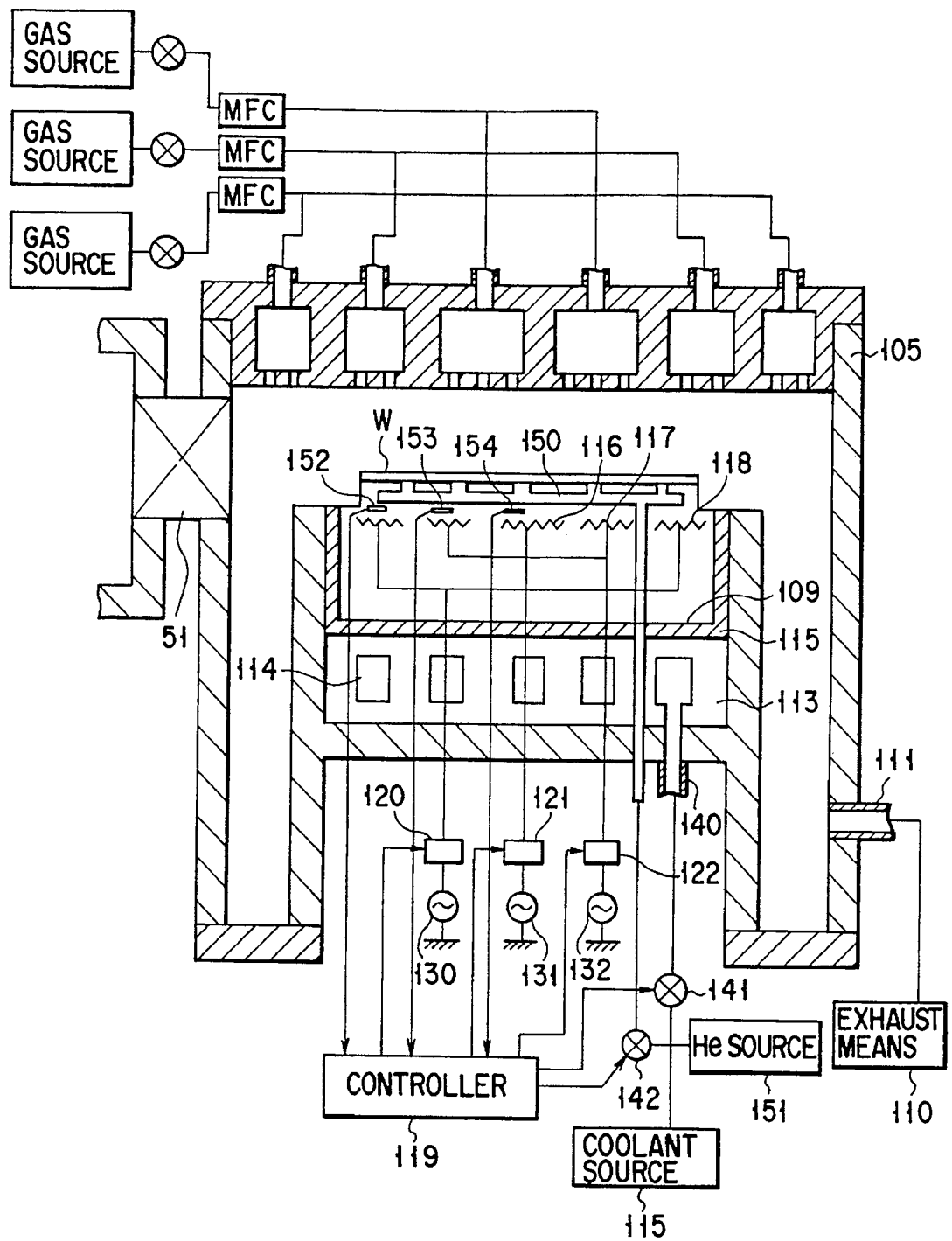
F I G. 36

VACUUM PROCESSING APPARATUS

BACKGROUND OF THE INVENTION

1. Field of the Invention

The present invention relates to a vacuum processing apparatus for performing a process such as film formation, etching, or the like with respect to a target object in a vacuum.

2. Description of the Related Art

In a step of manufacturing a semiconductor wafer, a one-by-one type CVD apparatus is used as a thin film formation apparatus for forming an insulating film or a thin silicon film on the surface of a semiconductor wafer. Such a one-by-one type processing CVD apparatus has an airtight processing chamber for performing film formation in a vacuum atmosphere, and a mounting table for holding the wafer is provided therein. An electrostatic chuck for chucking the semiconductor wafer is provided to the upper surface of this mounting table utilizing an electrostatic force.

Such an electrostatic chuck has a structure in which the upper and lower surfaces of a thin conductive member are in contact with insulating layers to sandwich the thin conductive member. The wafer is chucked and held by a Coulomb force or a Johnsen-Rahbeck force generated when a direct-current voltage is applied to said conductive member.

In a CVD apparatus, in order to assure uniformity in film formation, inplane uniformity in a target object, i.e., inplane uniformity of a temperature distribution is required. Conventionally, a heating unit for heating a target object to a proper temperature is provided in the processing chamber. As this heating unit, a heating unit is arranged on the lower surface side of the electrostatic chuck at a position away from the electrostatic chuck, and heat of a heating element of the heating apparatus is transferred to the above electrostatic chuck by radiation.

However, when the electrostatic chuck and the heating unit are provided away from each other, and a wafer on the electrostatic chuck is heated by heat radiated from the heating unit, the following problems are posed.

First, since heat from the heating unit is transferred by radiation, a high transfer efficiency cannot be obtained. In addition, this type of mounting table is normally provided in an airtight processing chamber set in a vacuum atmosphere of, e.g., $10^{-6}$ Torr. When the heating unit is set in the processing chamber, a heat transfer efficiency further decreases. For this reason, the heating unit must be set in an atmosphere out of the processing chamber.

As a heating unit having an improved heat efficiency, a heating unit in which e.g., a coiled heating resistor is provided on the object-mounting surface of the mounting table and heats a target object is known. In this case, however, since the heating element is close to a semiconductor wafer as a target object, the influence of the arrangement pattern of the heating element directly appears on the wafer. A uniform process cannot be performed due to nonuniformity of a temperature distribution on the basis of this. In the CVD apparatus, if such nonuniformity of a temperature distribution occurs, a uniform film cannot be formed.

Furthermore, since the mounting table on which the electrostatic chuck is placed and the heating unit are independently provided, the large number of members and a long time for assembly are required, resulting in an inevitable increase in cost accordingly.

In the one-by-one type CVD apparatus, a thin film must be uniformly grown on a semiconductor wafer as a target object. For this purpose, a reactive processing gas must be uniformly supplied onto the entire surface of the semiconductor wafer. Conventionally, in order to uniformly supply a reactive processing gas onto the entire surface of the semiconductor wafer, a shower head on which a plurality of holes are formed in a gas blow surface is provided to the top portion of the processing chamber.

When a processing gas is uniformly blown from the surface of the shower head opposing a target object by the conventional shower head, the flow rate of the processing gas tends to increase from the central portion of the target object to the end portion thereof. For this reason, a concentration boundary layer of the processing gas becomes thicker toward the central portion of the semiconductor wafer, and becomes thinner toward the end portion thereof. As a result, even if the processing gas is uniformly supplied from the gas blow surface of the shower head into the processing chamber, it is difficult to distribute the processing gas onto the reactive surface of the semiconductor wafer with a uniform concentration. Therefore, a film formation rate may be nonuniform.

The electrostatic chuck needs to be powered by a high voltage power supply, and the heating element for heating a target object needs to be powered by a power supply which can supply a high power, i.e., a so-called large current. As described above, however, since the CVD film formation apparatus performs a process in a vacuum atmosphere, discharge between conductive members tends to occur. In addition, heavy metal contamination to a target object may occur from an exposed wiring portion at a portion near a heater due to generation of a metal vapor. For this reason, wiring must be performed in the outer atmosphere. Therefore, since wiring requires a structure isolated from a vacuum atmosphere, the structure becomes complicated. Since this structure contacts a heating temperature atmosphere to a target object, good durability may not be kept. For this reason, not only the isolated structure becomes complicated, but also a cost increases due to need of such a structure.

SUMMARY OF THE INVENTION

It is an object of the present invention to provide a vacuum processing apparatus which has a high efficiency of heat transfer from a heating unit, and improves thermal uniformity in a target object such as a semiconductor wafer.

It is another object of the present invention to provide a vacuum processing apparatus having a high process uniformity with respect to a target object.

It is still another object of the present invention to provide a vacuum processing apparatus capable of providing a power supply wiring for an electrostatic chuck or heater in a processing chamber kept in a vacuum.

It is still another object of the present invention to provide a mounting table of a target object used for such a vacuum processing apparatus and comprising an electrostatic chuck and a heating function.

According to the first aspect of the present invention, there is provided a vacuum processing apparatus comprising:

a processing chamber for processing a target object in a vacuum;

a mounting member provided in the processing chamber and having a mounting surface for mounting the target object;

electrostatic chuck means, provided to the mounting surface of the mounting member, for chucking the target object;

heating means for heating the target object; and processing gas supply means for supplying a processing gas for processing the target object into the processing chamber, wherein the mounting member has a base, a first insulating layer formed on a surface of the base, and a second insulating layer formed on the first insulating layer, and has a conductive layer between the first insulating layer and the second insulating layer on a mounting surface side of the mounting member to obtain the electrostatic chuck means constituted by the first insulating layer, the second insulating layer, and the conductive layer, and the heating means has a heating member provided between the first insulating layer and the second insulating layer on a surface side opposing the mounting surface of the mounting member.

According to the second aspect of the present invention, there is provided a vacuum processing apparatus comprising:

a processing chamber for processing a target object in a vacuum;

a mounting member provided in the processing chamber and having a mounting surface for mounting the target object;

electrostatic chuck means, provided to the mounting surface of the mounting member, for chucking the target object;

heating means for heating the target object; and processing gas supply means for supplying a processing gas for processing the target object into the processing chamber, wherein the mounting member has an insulating base and an insulating layer formed on a surface of the base, and has a conductive layer between the base and the insulating layer on a mounting surface side of the mounting member to obtain the electrostatic chuck means constituted by the base, the insulating layer, and the conductive layer, and the heating means has a heating member provided between the base and the insulating layer on a surface side opposing the mounting surface of the mounting member.

According to the third aspect of the present invention, there is provided a vacuum processing apparatus comprising:

a processing chamber for processing a target object in a vacuum;

a mounting member provided in the processing chamber and having a mounting surface for mounting the target object;

heating means for heating the target object; and processing gas supply means for supplying a processing gas for processing the target object into the processing chamber, wherein the mounting member has a base and an insulating layer formed on a surface of the base, the heating means has a heating member having a spiral or concentric shape and provided to a surface opposing the mounting surface of the base of the mounting member at a predetermined interval, and a thickness of the base is set larger than the interval of the heating member.

According to the fourth aspect of the present invention, there is provided a vacuum processing apparatus comprising:

a processing chamber for processing a target object in a vacuum;

a mounting member provided in the processing chamber and having a mounting surface for mounting the target object;

heating means for heating the target object; and processing gas supply means for supplying a processing gas for processing the target object into the processing chamber, wherein the heating means has a central heating member provided to a surface opposing the mounting surface of the mounting member, and a side heating member provided to a side portion of the mounting member.

According to the fifth aspect of the present invention, there is provided a vacuum processing apparatus comprising:

a processing chamber for processing a target object in a vacuum;

a mounting member provided in the processing chamber and having a mounting surface for mounting the target object;

electrostatic chuck means, provided to the mounting surface of the mounting member, for chucking the target object; and processing gas supply means for supplying a processing gas for processing the target object into the processing chamber, wherein the electrostatic chuck means has an electrode to which a high voltage is applied, and an insulating layer interposed between the electrode and the target object, and the insulating layer has a volume resistivity within a range of $10^6$ to $10^{12}$ $\Omega$·cm during processing the target object, and a surface roughness Ra of a chucking surface thereof is 0.2 to 3.1 μm.

According to the sixth aspect of the present invention, there is provided a vacuum processing apparatus comprising:

a processing chamber for processing a target object in a vacuum;

a mounting member provided in the processing chamber and having a mounting surface for mounting the target object;

heating means for heating the target object;

control means for controlling the heating means; and processing gas supply means for supplying a processing gas for processing the target object into the processing chamber, wherein the heating means has a plurality of heating members provided to the mounting member so as to correspond to a plurality of regions concentrically formed on the mounting surface of the mounting member, and the control means independently controls outputs from the heating members.

According to the seventh aspect of the present invention, there is provided a vacuum processing apparatus comprising:

a processing chamber for processing a target object in a vacuum;

a mounting member provided in the processing chamber and having a mounting surface for mounting the target object;

heating means for heating the target object;

processing gas supply means for supplying a processing gas for processing the target object into the processing chamber; and control means for controlling a supply amount of the processing gas from the processing gas supply means, wherein the processing gas supply means is provided opposite to the target object, and has a processing gas feed member having a plurality of gas discharge regions divided concentrically, and the control means independently controls gas discharge amounts from the respective regions.

According to the eighth aspect of the present invention, there is provided a vacuum processing apparatus comprising:

a processing chamber for processing a target object in a vacuum;

a mounting member provided in the processing chamber and having a mounting surface for mounting the target object;

a power reception portion to which power is supplied in processing a target object;

a receptacle terminal having an opening portion with a bottom, a contact provided to a proximal end side thereof, and an insulating cover formed at an opening end side thereof, and electrically connected to the power reception portion; and a plug terminal which can be forced into the receptacle terminal and contacts the contact during being forced.

According to the ninth aspect of the present invention, there is provided a mounting table having an electrostatic chuck function and a heating function, comprising:

a mounting member having a mounting surface for mounting a target object;

electrostatic chuck means, provided to the mounting surface of the mounting member, for chucking the target object; and heating means for heating the target object, wherein the mounting member has a base, a first insulating layer formed on a surface of the base, and a second insulating layer formed on the first insulating layer, and has a conductive layer between the first insulating layer and the second insulating layer on a mounting surface side of the mounting member to obtain the electrostatic chuck means constituted by the first insulating layer, the second insulating layer, and the conductive layer, and the heating means has a heating member provided between the first insulating layer and the second insulating layer on a surface side opposing the mounting surface of the mounting member.

According to the tenth aspect of the present invention, there is provided a mounting table having an electrostatic chuck function and a heating function, comprising:

a mounting member having a mounting surface for mounting a target object;

electrostatic chuck means, provided to the mounting surface of the mounting member, for chucking the target object; and heating means for heating the target object, wherein the mounting member has an insulating base and an insulating layer formed on a surface of the base, and has a conductive layer between the base and the insulating layer on a mounting surface side of the mounting member to obtain the electrostatic chuck means constituted by the base, the insulating layers, and the conductive layer, and the heating means has a heating member provided between the base and the insulating layer on a surface side opposing the mounting surface of the mounting member.

Note that it is intended that the vacuum processes in the present invention include all processes performed at a pressure lower than the atmospheric pressure.

BRIEF DESCRIPTION OF THE DRAWINGS

FIG. 10 is a graph showing a relationship between a voltage supplied to an electrode and a leakage current when the surface roughness of each insulating layer of the electrostatic chuck is changed;

FIG. 11 is a graph showing a relationship between a voltage supplied to an electrode and a chucking force when the surface roughness of each insulating layer of the electrostatic chuck is changed;

FIG. 21 is a graph showing a distribution of the thickness of a concentration boundary layer when a processing gas is supplied from the shower head to the semiconductor wafer;

FIG. 22 is a sectional view showing a modification of the apparatus in FIG. 18;

FIG. 26 is a graph showing a distribution of the flow rate of a gas when the processing gas is supplied from the shower head having different diameters onto a semiconductor wafer;

FIG. 27 is sectional view showing another example of a shower head;

FIGS. 31A to 31C are sectional views for explaining steps of a surface treatment in a receptacle terminal of the power supply portion;

FIG. 32 is a view showing another example of a receptacle terminal;

FIG. 33 is a perspective view for explaining the structure of a plug terminal of the power supply portion;

FIG. 36 is a sectional view showing a CVD apparatus on which the shower head in FIG. 23 is incorporated in the apparatus in FIG. 18.

DETAILED DESCRIPTION OF THE PREFERRED EMBODIMENTS

Preferred embodiments of the present invention will be described below with reference to the accompanying drawings.

Figure 1:
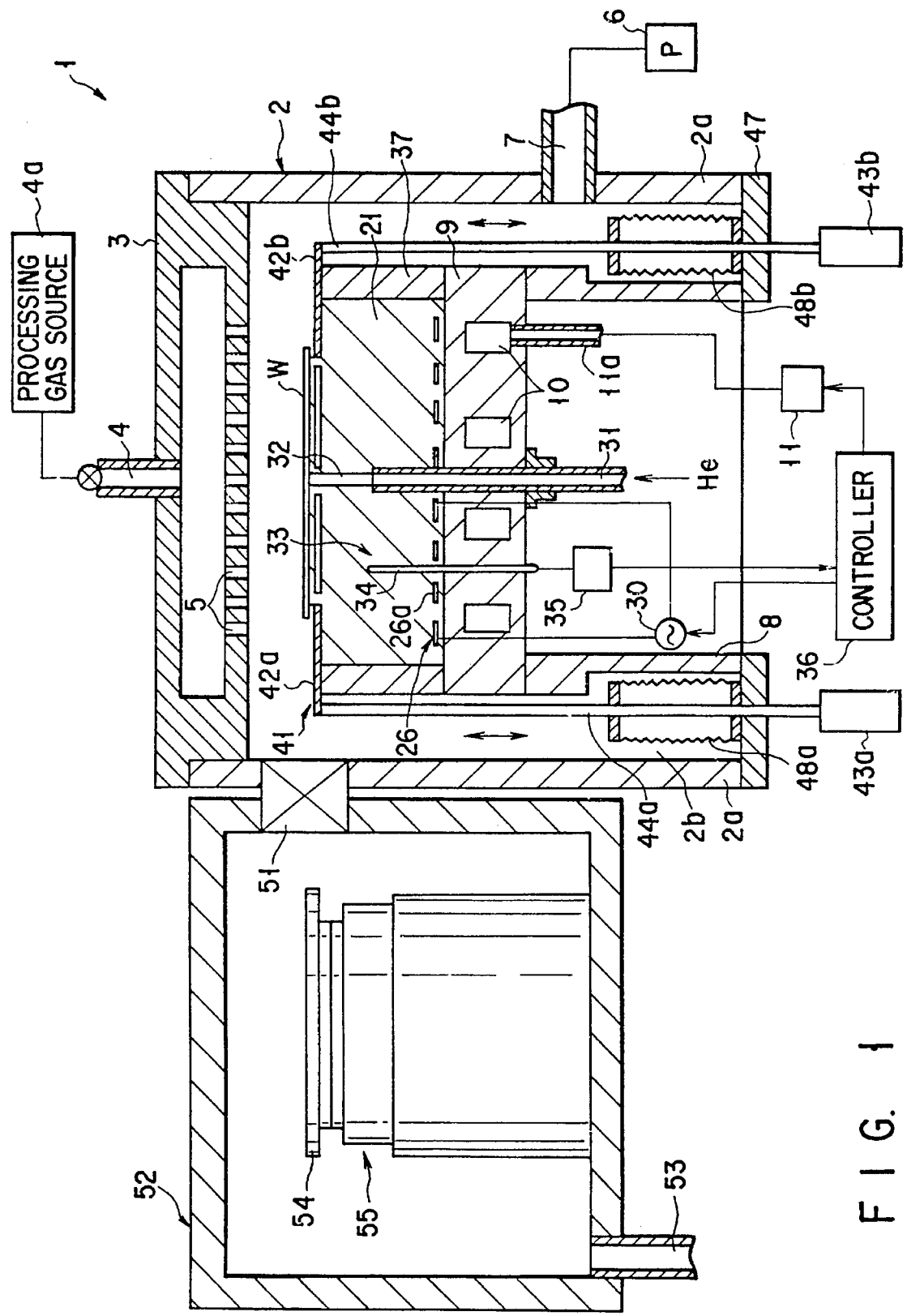
FIG. 1 is a sectional view showing a sheet processing cold wall type CVD apparatus according to the first embodiment of the present invention.

FIG. 1 is a sectional view showing a one-by-one type cold wall CVD apparatus according to the first embodiment of the present invention. This CVD apparatus 1 has a substantially cylindrical airtight processing chamber 2. A mounting table 21 for mounting a semiconductor wafer W as a target object is provided in the processing chamber 2.

A hollow disk-like shower head 3 is airtightly provided to the upper surface of the processing chamber 2. A processing gas feed pipe 4 is connected to the upper portion of this shower head 3. A large number of discharge ports 5 are provided in its surface opposing the mounting table 21. The processing gas feed pipe 4 is connected to a gas supply source 4a. A processing gas, e.g., a gas mixture of $SiH_4$ (silane) and $H_2$ is guided from this gas supply source 4a to the hollow portion of the shower head 3 through the processing gas feed pipe 4, and is uniformly discharged to the mounting table 21 in the processing chamber 2 through the large number of discharge ports 5.

An exhaust pipe 7 communicating with an exhaust means 6 such as a vacuum pump is provided near the bottom portion of the processing chamber 2. The processing chamber 2 is held in a predetermined low-pressure atmosphere, e.g., at $10^{-6}$ Torr by the operation of the exhaust means 6.

The bottom portion of the processing chamber 2 is constituted by a bottom plate 9 supported by a substantially cylindrical support member 8. A cooling water reservoir 10 is provided in the bottom plate 9. Cooling water is supplied from a cooling water source 11 to this cooling water reservoir 10 through a cooling water pipe 11a. Cooling water in the cooling water reservoir 10 is discharged from an exhaust pipe (not shown) and circulated in the cooling reservoir 10.

Figure 2:
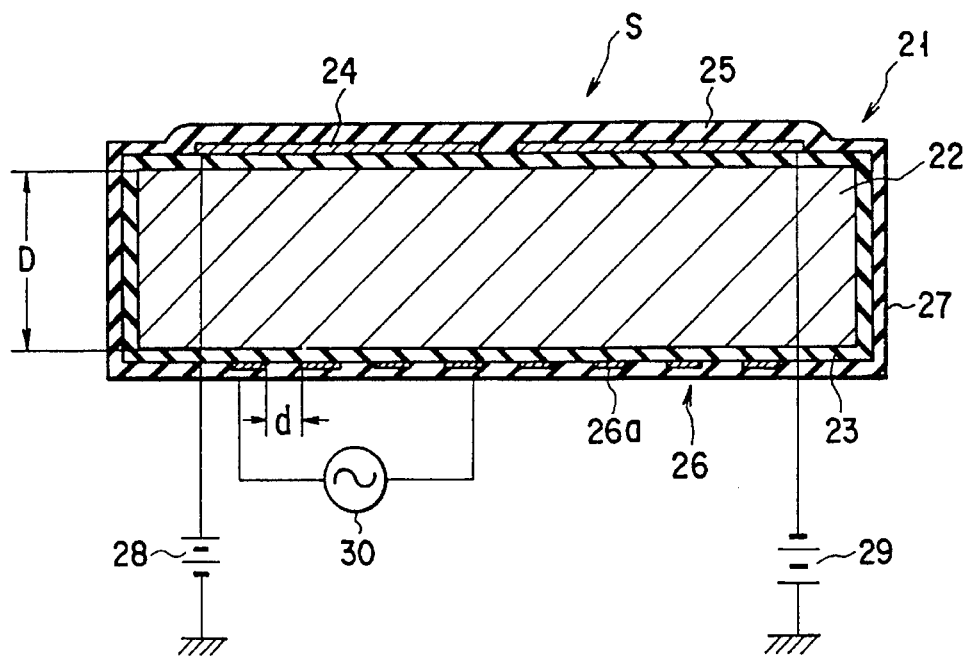
FIG. 2 is a sectional view for explaining the structure of a mounting table for a semiconductor wafer used for the apparatus in FIG. 1.
Figure 3:
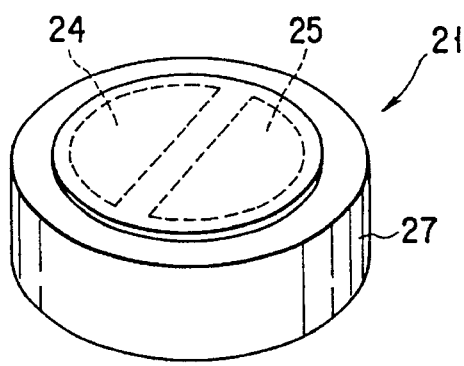
FIG. 3 is a perspective view showing the mounting table.

The mounting table 21 is set on the upper surface of the bottom plate 9. The outer circumference of its side surface is surrounded by a substantially cylindrical partitioning wall 37. As shown in FIGS. 2 and 3, this mounting table 21 is constituted by a base 22, a first insulating layer 23 provided so as to cover the surface of the base 22, thin conductive members 24 and 25 provided to the upper surface of the first insulating layer 23, a heater 26 directly provided to the lower surface of the first insulating layer 23, and a second insulating layer 27 formed on the outermost layer so as to cover the first insulating layer 23, the electrodes 24 and 25, and the heater 26.

The base 22 has a substantially disk-like shape having a predetermined thickness and a diameter of, e.g., 280 mm, and is formed of, e.g., C (carbon) or BN (boron nitride). The first insulating layer 23 formed on the surface of the base 22 by means of CVD process is formed of a thin film of, e.g., P—BN (pyrolyric boron nitride), $SiO_2$ (silicon oxide), AlN (aluminum nitride), $Al_2O_3$ (alumina), or $Si_3N_4$ (silicon nitride).

The conductive members 24 and 25 formed on the upper surface of the first insulating layer 23 have a substantially semicircular shape. The conductive members 24 and 25 are independently connected to DC high-voltage power supplies 28 and 29 arranged outside the processing chamber 2 and having different polarities from each other. The first insulating layer 23, the second insulating layer 27, and the electrodes 24 and 25 constitute a so-called bipolar type electrostatic chuck S.

The heater 26 arranged on the lower surface of the first insulating layer 23 has a heating pattern in which a substantially band-like heating element 26a is arranged in a coiled shape whose adjacent band portions are arranged at a proper interval (an interval in a radius direction) d. The heater 26 generates heat having a predetermined temperature, e.g., an arbitrary temperature within the range of 400° C. to 1,200° C. by an AC power supply 30 arranged outside the processing chamber 2. A plurality of heating elements may be concentrically arranged at proper intervals.

The second insulating layer 27 covering the surfaces of the conductive members 24 and 25 and the heater 26 comprises a thin film of, e.g., P—BN (pyrolytic boron nitride), $SiO_2$ (silicon oxide), AlN (aluminum nitride), $Al_2O_3$ (alumina), or $Si_3N_4$ (silicon nitride) formed by a CVD process in the same manner as in the first insulating layer 23.

A thickness (height) D of the base 22 is set larger than the interval d of the heating element 26a in the heater 26, and is, e.g., 20 to 40 mm.

The mounting table 21 having the above arrangement is set on the bottom plate 9 in the processing chamber 2 as described above. As shown in FIG. 1, a heat transfer medium supply pipe 31 extending through the bottom plate 9, and a flow path 32 communicating with the heat transfer medium supply pipe 31 are provided at the central portion of the mounting table 21. A heat transfer medium, e.g., an He gas, is supplied from the outside of the processing chamber 2 onto the lower surface of the semiconductor safer W mounted on the mounting table 21 through the heat transfer medium supply pipe 31.

A temperature sensor 33 is provided in the mounting table 21. This temperature sensor 33 comprises a detecting portion 34 provided in the base 22, and a measurement portion 35. The measurement portion 35 sequentially measures temperatures on the basis of signals from the detecting portion 34, and the signals from the measurement portion 35 are input to a controller 36. The controller 36 outputs control signals to the power supply 30 for the heater 26, the cooling water supply source 11, and the like on the basis of the signal from the temperature sensor 33 to adjust the output from the heater 26, the flow rate of the cooling water, or the like, thereby controlling the temperature of the mounting surface of the mounting table 21 to a predetermined value.

A lifter 41 is provided in the processing chamber 2 for lifting the semiconductor wafer W as a target object from the mounting table 21 and lowering it onto the mounting table 21. This lifter 41 comprises a pair of mounting members 42a and 42b, a pair of drive mechanisms 43a and 43b for driving these mounting members 42a and 42b, and a pair of support rods 44a and 44b for supporting the mounting members 42a and 42b by the corresponding drive mechanisms 43a and 43b.

The drive mechanisms 43a and 43b are constituted by, e.g., motors or cylinders, and provided below the processing chamber 2. The support rods 44a and 44b vertically extend in a space 2b formed by the partitioning wall 37, the side surface of the bottom plate 9, the side surface of the support member 8, and a side wall 2a of the processing chamber 2.

Figure 4:
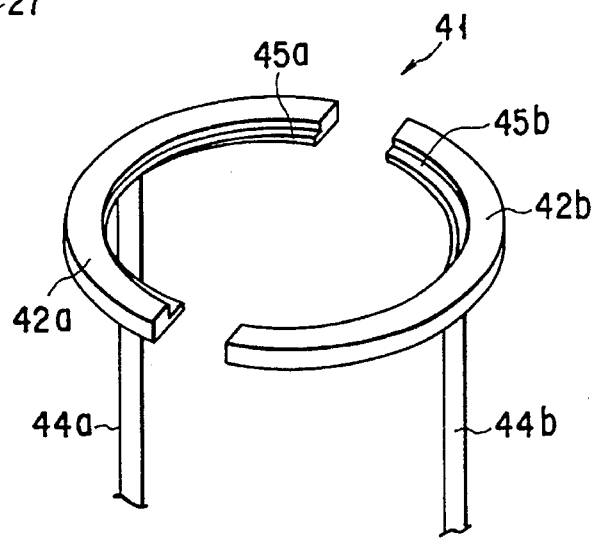
FIGS. 4 and 5 are views showing the main parts of lifters for a semiconductor wafer, respectively.

The mounting members 42a and 42b have a semi-annular shape conforming to the curvature of the wafer W as shown in FIG. 4. Arcuated stopper portions 45a and 45b extend from the inner circumferences of the corresponding mounting members 42a and 42b, respectively. The wafer W is supported by the mounting members 42a and 42b while the peripheral edge portion of the safer W is locked by the stopper portions 45a and 45b.

Figure 5:
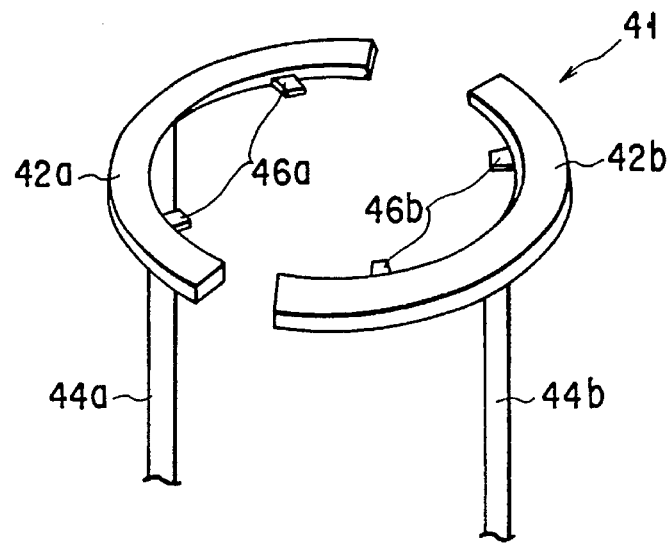

The lifter 41 may have an arrangement, e.g., shown in FIG. 5, in which stopper projections 46a and 46b are provided at several portions on the inner circumferences of the pair of semi-annular mounting members 42a and 42b, respectively.

As shown in FIG. 1, the support rods 44a and 44b are connected to the drive mechanisms 43a and 43b through an annular support plate 47 for airtightly closing the annular bottom portion of the above annular space 2b. The support rods 44a and 44b are vertically moved by the operations of the drive mechanisms.

The bellows 48a and 48b are disposed in the spaces where the support rods 44a and 44b on the support plate 47 extend, respectively. The airtightness in the processing chamber 2 is assured by the bellows 48a and 48b.

A load lock chamber 52 airtightly constituted through a gate valve 51 is provided to the side of the processing chamber 2 having the above arrangement. The interior of the load lock chamber 52 is evacuated by an exhaust pipe 53 provided to the bottom surface thereof. The interior of the load lock chamber 52 can be held in a predetermined low pressure atmosphere, e.g., at $10^{-6}$ Torr similar to the processing chamber 2.

A convey unit 55 having a convey arm 54 for conveying the wafer W between a cassette in a cassette housing chamber (not shown) adjacent to the load lock chamber 52 through a gate valve and the mounting table 21 in the processing chamber 2 is provided in the load lock chamber 52.

The operation of the CVD apparatus having this arrangement will be described next. The load lock chamber 52 is evacuated when the pressure of the load lock chamber 52 is equal to that of the processing chamber 2, the gate valve 51 is opened to convey the wafer W subjected to film formation above the mounting table 21 in the processing chamber 2 by the convey arm 54 of the convey unit 55.

At this time, the mounting members 42a and 42b of the lifter 41 are moved upward, and the wafer W is mounted on the stopper portions 45a and 45b of the respective mounting members 42a and 42b. Thereafter, the convey arm 54 retreats in the load lock chamber 52, and the gate valve 51 is closed.

The mounting members 42a and 42b are lowered to mount the wafer W on the mounting table 21. When a DC voltage from the DC high-voltage power supplies 28 and 29 is applied to the conductive members 24 and 25, the wafer W is chucked and held on the mounting table 21 by a Coulomb force or a Johnsen-Rahbeck force generated at the electrostatic chuck S, and the heat transfer medium (He gas) spreads on the lower surface of the wafer W at a predetermined pressure (e.g., 10 to 50 Tort).

Thereafter, the wafer W is heated to a predetermined temperature, e.g., 800° C. using heating by the heater 26 held at a high temperature. In addition, a processing gas, e.g., a gas mixture of $SiH_4$ (silane) and $H_2$ is supplied into the processing chamber 2 to start the film formation of the wafer W.

Since heat of the heating element 26a of the heater 26 is directly transferred to the wafer W by contact through the base 22, a heat transfer efficiency becomes higher than that using conventional radiation. As a result, the wafer W can be heated to the same temperature as that in the conventional apparatus using a lower power than that in the conventional apparatus.

As described above, since the thickness (height) D of the base 22 is set larger than the interval d of the heating element 26a in the heater 26, the pattern of the heating element 26a formed in a coiled shape does not influence the safer W to make it possible to uniformly heat the wafer W. Therefore, the film formation process can be uniformly performed with respect to the wafer W.

Since the heater 26 is integrally incorporated in the mounting table 21, the number of members can be smaller than that in the conventional apparatus. In addition, all the components including the heating mechanism can be arranged in the processing chamber 2. Therefore, assembly can be easily performed, and a cost can be decreased along with the decrease in number of components described above.

Since the first insulating layer 23 and the second insulating layer 27 are formed outer side of the mounting table 21 using a CVD process, the thickness of each layer is extremely uniformed. From this point of view, thermal uniformity of the wafer W is high. When P—BN, $SiO_2$, AlN, $Al_2O_3$, or $Si3N_4$ is used as a material of each layer, no thermal failure occurs even if the heater 26 is directly bonded. This is because each of the above materials is excellent in heat resistance. The mounting table 21 arranged in this manner has good durability.

Figure 6:
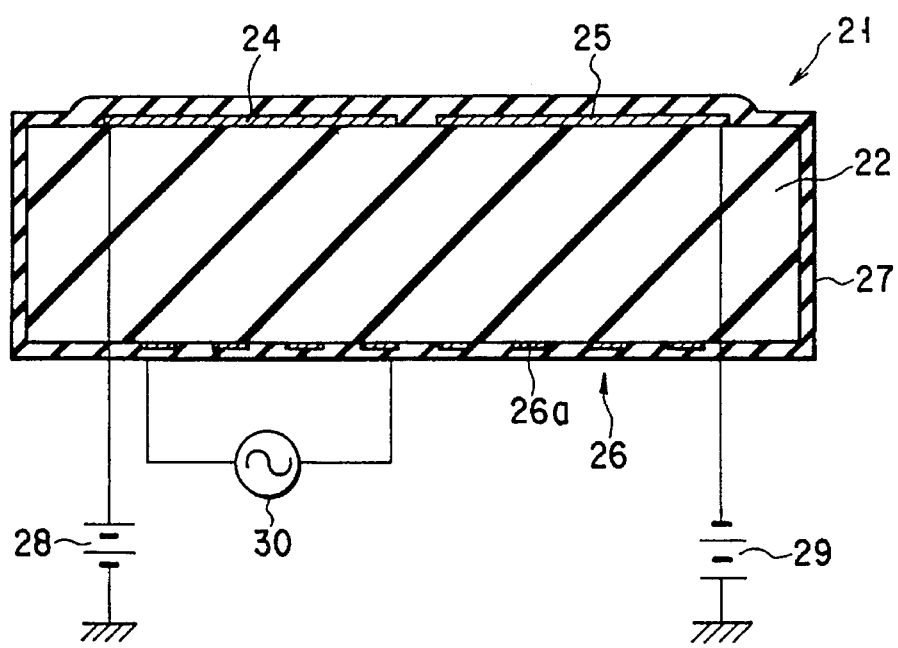
FIG. 6 is a sectional view showing a modification of a mounting table.

The structure of the mounting table 21 is not limited to the structure shown in FIG. 2. If the base 22 is insulative, the first insulating layer 23 may be omitted, and the second insulating layer may be formed on the surface of the base 22 as shown in FIG. 6. As an example of the mounting table 21 having the above structure, the base 22 consists of BN, and the second insulating layer 27 consists of P—BN, $SiO_2$, AlN, $Al_2O_3$, or $Si_3N_4$. With this structure, better durability can be obtained.

In order to realize the thermal uniformity of the wafer W and further, more precise temperature control, a circulation path of a proper coolant may be formed in, e.g., the base 22 of the mounting table 21.

As described above, the electrostatic chuck S chucks the wafer W by a Coulomb force or a Johnsen-Rahbeck force. If the volume resistivity of the first insulating layer 23 is about $10^{14}$ Ω·cm or more, an electrostatic chucking force is generated by the Coulomb force. Alternately, if the volume resistivity of the first insulating layer 23 is about less than $10^{14}$ Ω·cm, an electrostatic chucking force is generated by the Johnsen-Rahbeck force.

Figure 7:
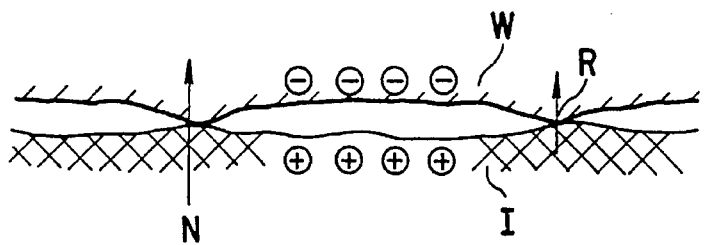
FIG. 7 is a view for explaining the principle of chucking by a Johnson-Rahbeck force.

Electrostatic chuck causing by a Johnsen-Rahbeck force will be described with reference to FIG. 7. As shown in FIG. 7, it is assumed that unevenness exists microscopically on the surface of an insulating layer I and the mounting surface of a semiconductor wafer W mounted thereon, and contact portions at which both surfaces contact each other, and non-contact portions exist at random. Assume that the volume resistivity value of the insulating layer I is less than $10^{14}$ Ω·cm. When a current i is caused to flow into the wafer W through the insulating layer I, a large potential drop locally occurs due to a contact resistances Rc at the contact points between the insulating layer I and the semiconductor wafer W. positive/negative electric charges are stored in the surfaces (forming a kind of capacitor) of the insulating layer I and the wafer W opposing the insulating layer I to generate an extremely strong electric field at portions having very small gaps on the both sides of the contact points. As a result of a strong Maxwell distortion force, an electric chucking force is generated. Such an effect is called a Johnsen-Rahbeck effect, and an electric chucking force generated at this time is called a Johnsen-Rahbeck force.

Figure 8:
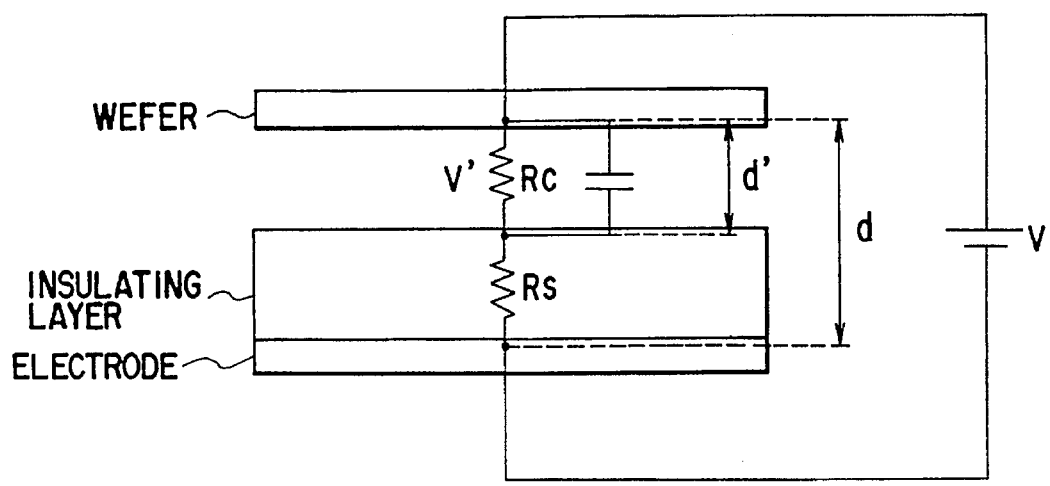
FIG. 8 is a view showing a state in which a Johnson-Rahbeck force operates in an electrostatic chuck.

This Johnsen-Rahbeck force is represented as a function of a potential subsidence V' caused by the contact resistance Rc as shown in FIG. 8.

When an applied voltage is defined as V; the volume resistivity of an insulating layer, Rs; a distance between a wafer and the insulating layer, d'; and a distance between the wafer and an electrode, d, the above potential subsidence V' is represented as follow:

$$V'=V \cdot Rc/(Rc+Rs)$$

and a Johnsen-Rahbeck force F is represented as follow:

$$F=(1/8\pi) \cdot (V'/d')^2$$

Figure 9:
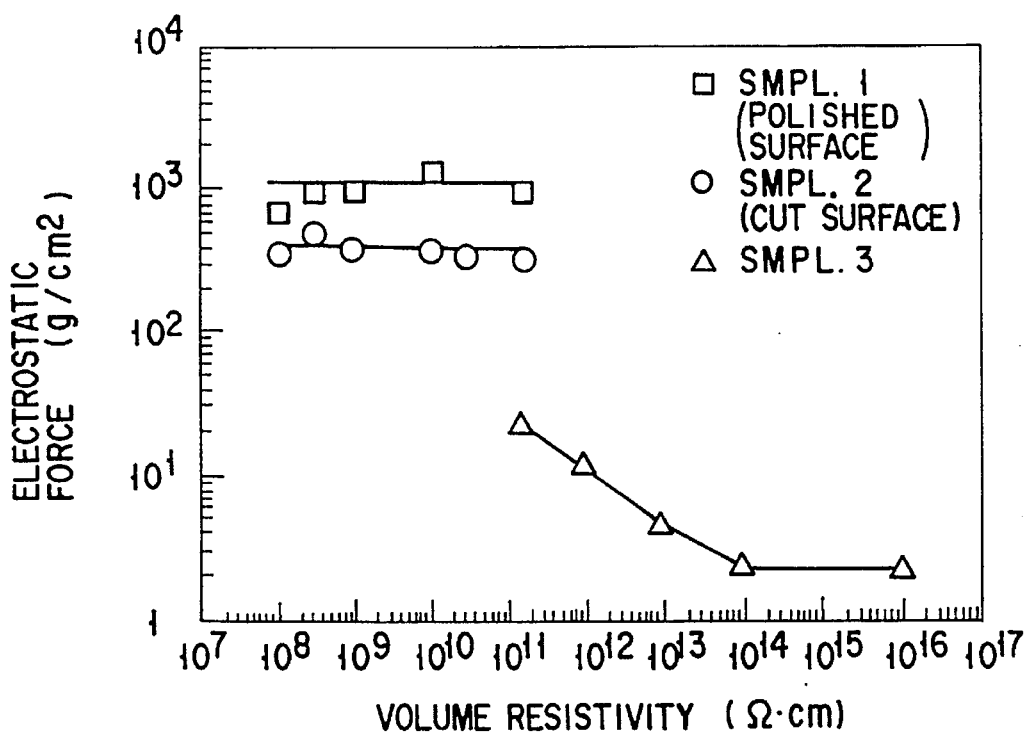
FIG. 9 is a view showing a relationship between a volume resistivity and an electrostatic force in insulating layers of the electrostatic chuck.

FIG. 9 is a graph obtained by plotting electrostatic forces when a polished alumina sample 1, a cut sample 2, and a roughened sample 3 are used as insulating layers, and volume resistivities thereof are changed by changing their temperatures.

As is apparent from FIG. 9, when the volume resistivity is $10^{14}$ Ω·cm or more, the electrostatic force becomes small; when the volume resistivity is $10^{11}$ Ω·cm or less, the electrostatic force becomes large due to the following reason. When the volume resistivity of each insulating layer is $10^{14}$ Ω·cm or more, volume resistivity Rs is dominant in a series resistance constituted by the volume resistivity Rs and the contact resistance Rc as shown in FIG. 8 to make the value V' small, resulting in a small electrostatic force. In contrast to this, when the volume resistivity of each insulating layer is $10^{11}$ Ω·cm or less, Rc is dominant, resulting in a large electrostatic force. The volume resistivity Rs and the contact resistance are balanced in the intermediate region, resulting in a medium electrostatic force.

It is generally known that when the temperature of an insulating member such as a ceramic member is increased, the volume resistivity thereof exponentially decreases. For example, when a semiconductor wafer W as a target object is to be heated by a heating unit in a CVD apparatus or the like, the temperature of the insulating member inevitably increases, resulting in a decrease in volume resistivity. Therefore, when the volume resistivity is $10^{11}$ Ω·cm or less by such a temperature increase, an electrostatic force based on a Johnsen-Rahbeck force increases. With this increase, a leakage current flowing between the insulating layer and the wafer also increases, and a semiconductor circuit formed on the wafer may be damaged.

At a low volume resistivity, the surface of the insulating layer is toughened to a certain degree so as to increase the Rc, thereby decreasing a leakage current. That is, in order to decrease a leakage current, the surface roughness of the insulating layer is set larger.

FIG. 10 is a graph obtained by plotting the values of leakage currents when SiC (thickness: 1 mm; surface roughnesses: Ra:0.24 and 0.90) having a volume resistivity of $10^{11}$ Ω·cm or less is used as insulating layers, and the applied voltage V is changed at room temperature in the state shown in FIG. 8. It is apparent from FIG. 10 that a leakage current becomes smaller when the surface roughness Ra is larger.

On the other hand, as shown in FIG. 11, a chucking force becomes larger when the surface roughness Ra is smaller.

As described above, a leakage current is in inverse proportion to an electrostatic chucking force (electrostatic force). For this reason, when the volume resistivity of the insulating layer is low, the surface roughness of the insulating layer must be set to a value such that a leakage current becomes small with a proper chucking force.

More specifically, when the volume resistivity of the insulating layer falls within the range of $10^6$ to $10^{12}$ Ω·cm, the surface roughness Ra of the insulating layer is adjusted within the range of 0.2 to 3.1 (unit: µm), thereby decreasing a leakage current with a proper chucking force.

When the volume resistivity of the insulating layer is less than $10^6$ Ω·cm, a leakage current cannot be satisfactorily decreased even if the surface roughness falls within the above range. When the volume resistivity exceeds $10^{12}$ Ω·cm, such a condition need not be taken into account because the influence of a leakage current is small. When the volume resistivity of the insulating layer is $10^{10}$ to $10^{11}$ Ω·cm, a leakage current can be more effectively decreased.

When the surface roughness Ra of the insulating layer is less than 0.2, a leakage current cannot be effectively decreased. When the Ra exceeds 3.1, an electrostatic force become excessively small. The preferred surface roughness is within the range of 0.8 to 1.0.

Such conditions can be applied in the case that the insulating layer is heated to cause its volume resistivity to fall within the above range, or in the case that a material having a volume resistivity falling within the above range at room temperature is used as an insulating layer. The above-described P—BN, $SiO_2$, AlN, $Al_2O_3$, SiN, or the like can be used as a material of the insulating layer in this case, and SiC having a lower volume resistivity than those of the above materials can also be used.

The second embodiment of the present invention will be described below.

A CVD apparatus according to this embodiment is arranged in almost the same manner as in the first embodiment except for a mounting table.

Figure 12:
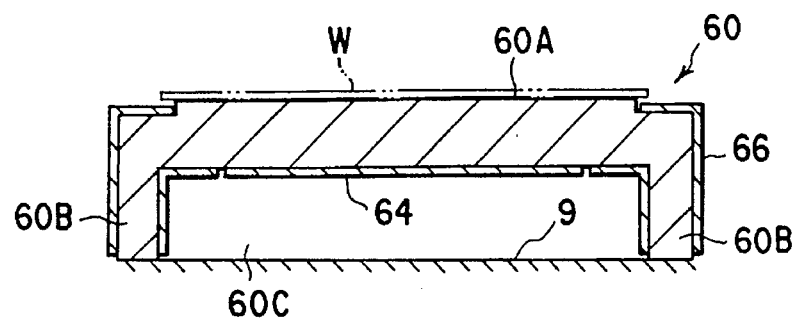
FIG. 12 is a sectional view showing an example of a mounting table for a semiconductor wafer applied to a CVD apparatus according to the second embodiment of the present invention.

FIG. 12 is a sectional view showing a mounting table 60 used in this embodiment. The mounting table 60 is formed of, e.g., boron nitride (BN). A mounting surface 60A for mounting a semiconductor wafer W as a target object is formed on the upper surface of the mounting table 60. The same electrostatic chuck (not shown) as in the first embodiment is arranged on the mounting surface 60A. The semiconductor wafer W is electrostatically chucked and held by the electrostatic chuck.

On the other hand, a ring-like leg portion 60B extending downward from the peripheral edge of the mounting table 60 is provided to the lower surface of the mounting table 60. A space 60C is formed so as to be surrounded by this leg portion 60B. The lower surface of the leg portion 60B is mounted on a bottom plate 9 positioned below the leg portion 60B and constituted in the same manner as the apparatus in the first embodiment. The space 60C surrounded by the bottom plate 9 and the leg portion 60B is kept in a vacuum state by an exhaust mechanism (not shown). Therefore, a region in which the mounting table 60 contacts the bottom plate 9 is smaller than that in which the entire lower surface of the mounting table 60 contacts a lower mounting table.

A central heating member 64 is provided to the lower surface of the mounting table 60, and a side heating member 66 is provided to the outer portion thereof.

The central heating member 64 and the side heating member 66 comprise conductive heating resistors. The central heating member 64 is provided to a portion of the lower surface of the mounting table 60 opposing the mounting surface 60A of the ceiling surface of the space 60C to have a size capable of heating the entire surface of the semiconductor safer W. The side heating member 66 is provided to a region corresponding to the peripheral portion of the mounting surface 60A in the upper surface of the mounting table 60 and the side surface of the mounting table 60. Therefore, heating sources are provided to the almost entire area of the mounting table 60 except for the mounting surface 60A on the surface thereof.

The heating member is also provided in the leg portion 60B in FIG. 12. The heating member, however, need not be arranged in this portion. This is because the interior of the space 60C is kept in a vacuum state, i.e., a so-called vacuum heat-insulated state, and heat toward the interior of the space 60C rarely occurs. Therefore, the indispensable heating source provided to the side portion of the leg portion 60B is the heating source on the outer side surface where heat from the mounting table 60 becomes typically dissipated. The heating member 66 is preferably arranged in a region on the upper surface of the mounting table 60 except for the mounting surface 60A.

With this arrangement, the semiconductor wafer W as a target object is heated mainly by the central heating source 64 positioned on the lower surface of the mounting table 60. In this case, since the safer W is heated through the mounting table, appearance of the heating pattern of the heating member on the mounting surface 60A of the wafer is substantially prevented. Therefore, the heating pattern of the heating member is not transferred onto the lower surface of the semiconductor wafer W as a target object. In addition, since the peripheral edge of the mounting table 60 is heated by the side heating member 66, i.e., so-called heat replenishment is performed, heat dissipation is suppressed, and uniformity of a temperature distribution of the surface of the mounting table 60 is kept.

On the other hand, since the leg portion 60B is provided to the lower surface of the mounting table 60, and the heating member is positioned on the outer side surface or the inner side surface thereof, a contacting heat transfer portion is made small to suppress a heat loss caused by heat transfer. Furthermore, since the leg portion 60B has a significant length, abrupt reduction in a heat holding amount can be prevented. With this arrangement, a change in temperature distribution on the mounting surface can be prevented.

More specifically, in comparison with a short distance to a radiation portion in the leg portion 60B, a distance to the radiating portion is increased, and heating is performed so as to supplement heat radiation to the position. The temperature to the radiating position can smoothly decrease, and in other words, the moderate temperature gradient can be obtained. For this reason, the influence of heat dissipation on the mounting surface can be reduced, and the change in temperature distribution on the mounting surface can be reduced. A portion where the temperature abruptly changes can be eliminated with such a moderate temperature gradient to prevent apparatuses from being thermally damaged.

Figure 13A:
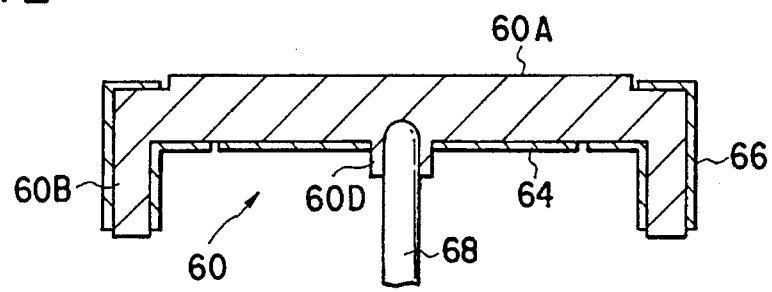
FIG. 13A is a sectional view showing a state in which a temperature sensor is inserted into the mounting table in FIG. 12.

Temperature sensors 68 used for controlling energization to the heating member are provided to the mounting table 60 as shown in FIG. 13A. FIG. 13A is a view showing a mounted state of a temperature sensor, provided to the central portion of the mounting table 60, among the above temperature sensors. The temperature sensor 68 has a structure in which, e.g., a thermocouple is arranged in a quartz tube. Such a temperature sensor 68 is arranged at a position in addition to the central portion of the mounting table 60 as will be described later. A cylindrical portion 60D is formed at the mounted position of each temperature sensor 68 on the mounting table 60 so as to extend from the lower surface of the mounting table 60. The head portion of each temperature sensor 68 is inserted into the cylindrical portion 60D to support the temperature sensor 68.

Figure 13B:
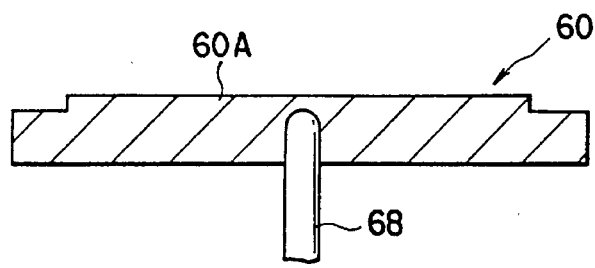
FIG. 13B is a sectional view showing a state in which a temperature sensor is inserted into a conventional mounting table.

Normally, as shown in FIG. 13B, each temperature sensor 68 is inserted with its head portion adjacent to the mounting surface 60A. With this mounting structure, however, heat on the mounting surface 60A is easily radiated due to heat transfer to the temperature sensors 68. Therefore, when a temperature at a portion where each temperature sensor is positioned decreases, the temperature distribution of the surface of the mounting surface 60A undesirably changes. The temperature of the head portion of each temperature sensor differs from that of the temperature sensor itself on the mounting surface not to accurately detect a temperature. In this embodiment, the cylindrical portion 60D is provided to a position at which the head portion of the temperature sensor 68 is supported, and a heat amount by which heat radiation caused by heat transfer can be supplemented is supplied by the cylindrical portion 60D. Therefore, the cylindrical portion 60D functions as a holder for supporting the head portion of each temperature sensor 68, and a heat loss caused by heat transfer to the temperature sensor 68 is supplemented, thereby preventing heat on the mounting surface from being deprived. For these reasons, the change in temperature distribution on the mounting surface 60A can be prevented, and errors caused by a decrease in temperature between the temperature on the mounting surface and the detected temperature can be prevented.

The temperature sensors 68 are preferably provided to a plurality of portions along the circumferential direction of the wafer W in monitoring temperatures on the entire target object. In order to prevent the temperature distribution of the mounting surface 60A on the mounting table 60 from being changed by heat transfer at the temperature sensors 68, as shown in FIG. 14, a minimum number, e.g., two, of temperature sensors are preferably provided to the central portion of the wafer W and the vicinity of the peripheral edge thereof, as will be described later.

Figure 14:
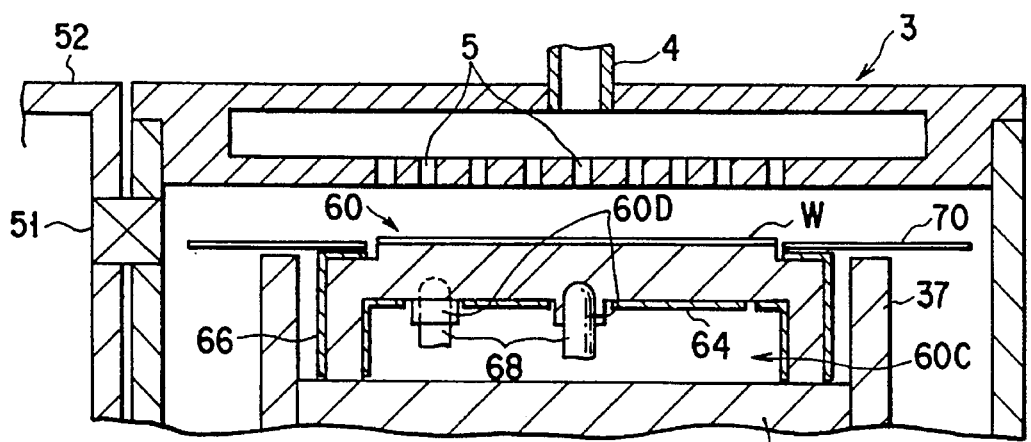
FIG. 14 is a sectional view showing the main part of the CVD apparatus to which the mounting table shown in FIG. 12 is applied.
Figure 15:
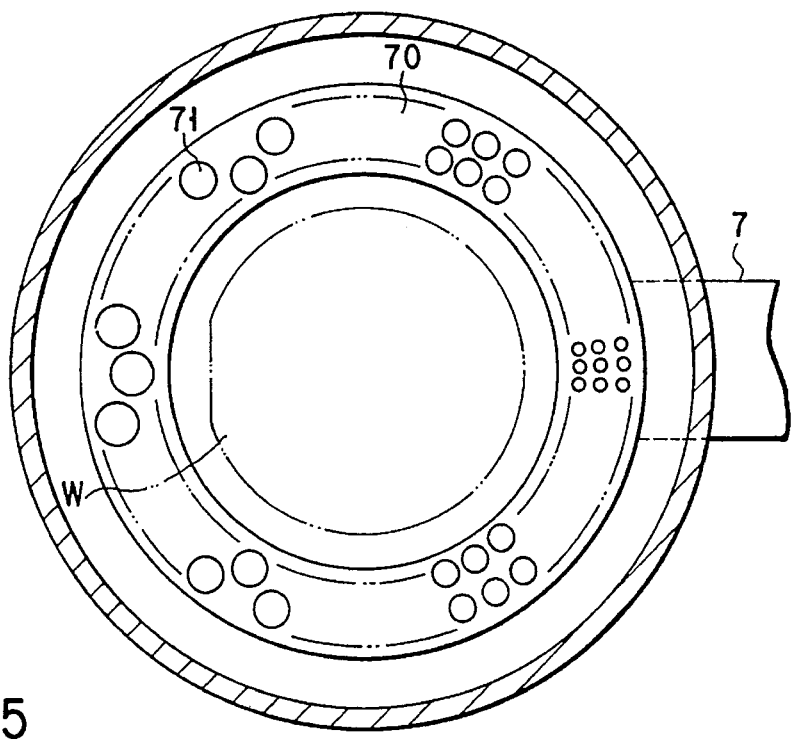
FIG. 15 is a horizontal sectional view of the apparatus in FIG. 14.

As shown in FIGS. 14 and 15, a baffle plate 70 can be arranged near the mounting table 60 without contacting the heating source 66 such that the baffle plate 70 covers the upper surface of the mounting table 60 except for the mounting surface 60A. This baffle plate 70 has a disk-like shape, and the inner side portion thereof consists of quartz or SiC, and the outer side portion thereof consists of another ceramic. As shown in FIG. 15, a plurality of exhaust ports 71 extending through in a direction of thickness are formed in the outer side portion. A processing gas exhausted from gas delivery ports 5 of a shower head 3 passes through these exhaust ports 71. For this reason, the diameters of the exhaust ports 71 become smaller as they are positioned near a side to which an exhaust pipe 7 is connected, thereby uniformly recovering the processing gas in a circumferential direction.

Figure 16:
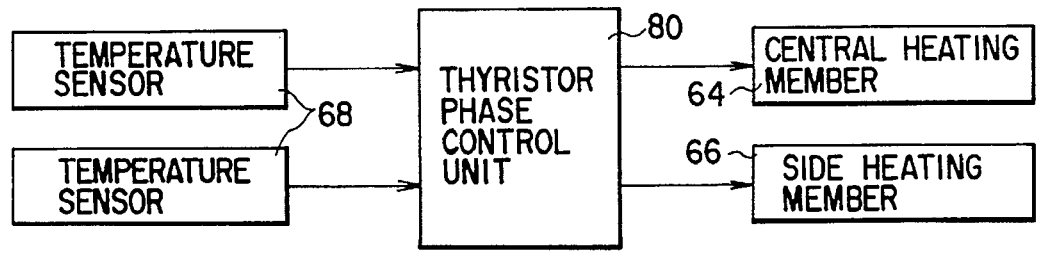
FIG. 16 is a block diagram showing a control system for central and side heating members provided to the mounting table shown in FIG. 12.

In this CVD apparatus having such an arrangement, the temperatures of the heating members are controlled to uniform the thickness of a film to be formed on the semiconductor safer W. In other words, the mounting table 60 is kept at a constant temperature by supplementing a heat amount at the circumferential portion of the mounting table 60 having a larger heat radiation amount than that at the central portion thereof, thereby uniforming the film thickness to be formed. For this reason, the central heating member 64 and the side heating member 66 described above are connected to corresponding power supply circuits and independently controlled. That is, electrical paths from power supplies (not shown) are connected to the central heating member 64 and the side heating member 66. As shown in FIG. 16, heat radiation amounts are controlled by a thyristor phase control unit 80. The thyristor phase control unit 80 performs energization control to the respective heating members 64 and 66 in response to an input signal concerning temperature information from the temperature sensors 68, thereby keeping the mounting table 60 at a uniform temperature.

Such temperature control is also executed to uniform a film formation rate which is influenced by the flow rate of a processing gas in a radial direction.

More specifically, it is confirmed by experiments and the like that the flow rate of a processing gas becomes faster at the peripheral side of the wafer W in a radial direction so that the concentration of the processing gas cannot be uniformed in the radial direction. In order to uniform the film thickness influenced by a contact time with a processing gas in the radial direction, the flow rate in the surface of the semiconductor wafer W is uniformed by adjusting a temperature gradient, which acts on the flow rate, on the mounting surface, thereby obtaining a constant contact time between a processing gas and a target object.

Figure 17:
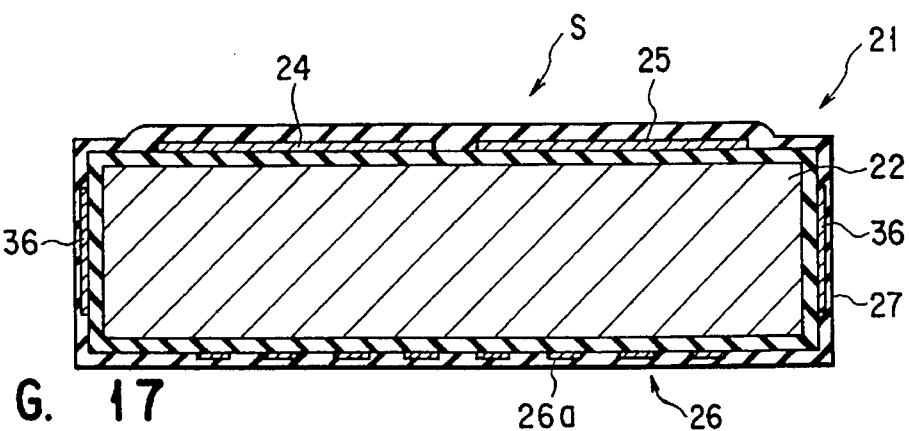
FIG. 17 is a sectional view showing still another example of a mounting table.

As shown in FIG. 17, the side heating member 66 according to this embodiment can be applied to the mounting table 21 of the apparatus according to the first embodiment. With this arrangement, uniformity of the temperature of the mounting table can be further increased.

The third embodiment will be described below.

Figure 18:
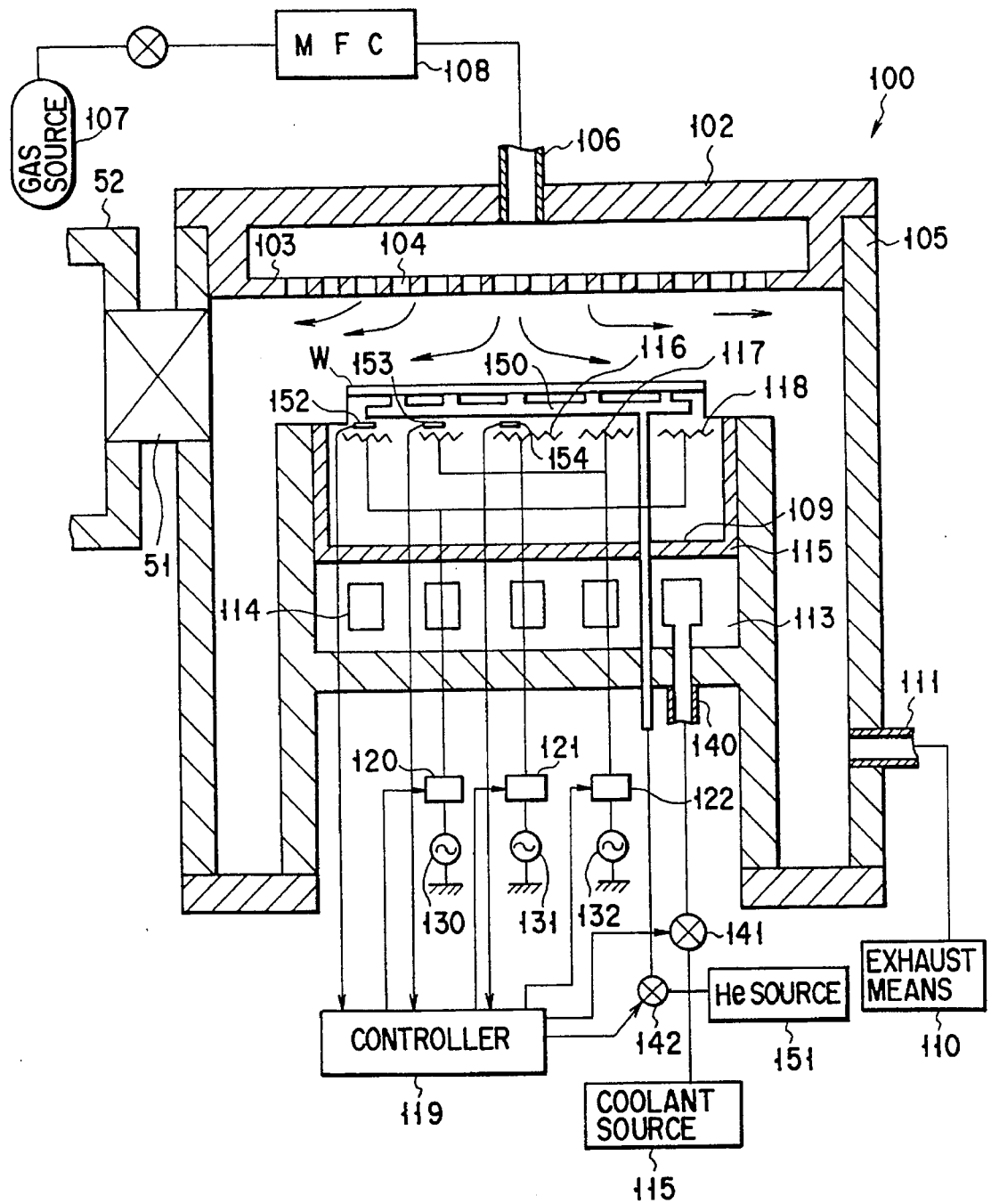
FIG. 18 is a sectional view illustrating a CVD apparatus according to third embodiment of the present invention.

FIG. 18 is a sectional view showing a one-by-one type CVD apparatus according to this embodiment. This one-by-one type CVD apparatus 100 has a substantially cylindrical airtight processing chamber 105, and a mounting table 109 for mounting a semiconductor wafer W as a target object is provided therein.

A hollow disk-like shower head 102 is airtightly provided to the upper surface of the processing chamber 105. A processing gas feed pipe 106 is provided to this shower head 102. A predetermined processing gas, e.g., a gas mixture of $SiH_4$ and $H_2$ can be supplied from a processing gas source 107 to the hollow portion of the shower head 102 through a mass-flow controller 108.

A multihole plate 103 in which a large number of gas discharge holes 104 are provided is set on the lower surface of the shower head 102, i.e., on the surface opposing the mounting table 109. A processing gas supplied from the processing gas feed pipe 106 is uniformly discharged from the hollow portion of the shower head 102 on the mounting table 109 in the processing chamber 105 through the gas discharge holes 104.

An exhaust pipe 111 communicating with an exhaust means 110 such as a vacuum pump is provided near the bottom portion of the processing chamber 105. The processing chamber 105 is held in a predetermined low-pressure atmosphere, e.g., at $10^{-6}$ Torr by the operation of the exhaust means 110.

The bottom portion of the processing chamber 105 is constituted by a bottom plate 113 supported by a substantially cylindrical support member 112. A cooling water reservoir 114 is provided in the bottom plate 113. Cooling water is supplied from a coolant source 115 to the cooling water reservoir 114 through a pipe 140. Cooling water in the cooling water reservoir 114 is discharged from an exhaust pipe (not shown) and circulated in the cooling water reservoir 114.

The mounting table 109 is set on the upper surface of the bottom plate 113 through a heat-insulating material 115. A supply path 150 for supplying a heat transfer medium onto the lower surface of the target object W is formed on this mounting table 109. A heat transfer medium, e.g., He, is supplied from an He source 151 to this supply path 150.

The supply amount of a heat transfer medium supplied onto the lower surface of the semiconductor wafer w through this heat transfer medium supply path 150 is controlled by adjusting the opening degree of a valve 142 using a control signal from a controller 119 to be described later.

First, second, and third heating members 116, 117, and 118 are substantially concentrically arranged in the mounting table 109. These heating members 116, 117, and 118 are respectively connected to power supplies 130, 131, and 132 through switches 120, 121, and 122 respectively constituted by solid state relays (SSR). Power supply is performed using these power supplies to generate heat. The solid state relays (SSR) 120, 121, and 122 corresponding to these heating members 116, 117, and 118 are turned on/off using control signals from the controller 119, thereby making it possible to independently control these heating members. In this embodiment shown in FIG. 18, the three heating members 116, 117, and 118 are substantially concentrically arranged. The present invention, however, is not limited to the above arrangement, and an arrangement may be applied in which an arbitrary number of heating members are mounted on a mounting table in an arbitrary layout, and a plurality of desired regions on the surface of the mounting table can be independently heated and insulated at desired temperatures.

Figure 19:
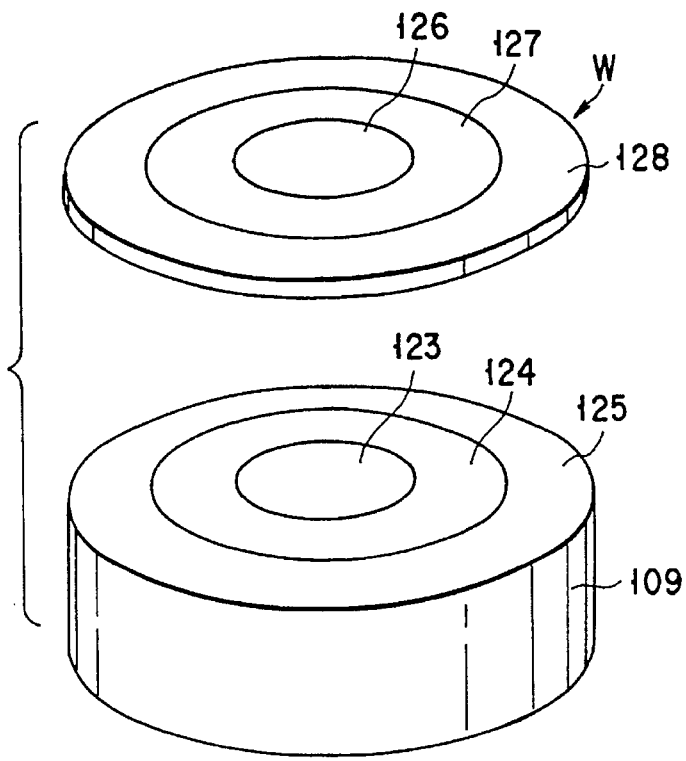
FIG. 19 is a perspective view illustrating the mounting surface of a mounting table in the apparatus shown in FIG. 18 and a plurality of heating regions of a semiconductor wafer.

As shown in FIG. 19, three substantially concentric heating regions 123, 124, and 125 corresponding to the respective heating members 116, 117, and 118 are formed. Temperature sensors 152, 153, and 154 are provided to these heating regions. Detection signals from these temperature sensors 152, 153, and 154 are input to the controller 119, and the controller 119 controls feedback of the supply amount of a heat transfer medium supplied to the heat transfer medium supply path 150 and that of outputs of the respective heating members 116, 117, and 118.

With this arrangement, the temperature of the mounting table 109 can be independently controlled in the three substantially concentric regions 123, 124, and 125, and the temperature can be set at different temperatures in these three regions. Heat of the mounting table 109 is supplied by heat transfer onto the lower surface of the semiconductor wafer W chucked and held by the mounting surface of the mounting table 109. For this reason, the temperature distribution thereof corresponds to three regions of the mounting table 109, and three substantially concentric regions 126, 127, and 128 are formed on the safer W corresponding to the regions 123, 124, and 125.

As a result, the peripheral region 128 of the semiconductor wafer in which the thickness of a concentration boundary layer of a processing gas is thin can be set at a lower temperature than that of the central region 126 of the semiconductor wafer in which the thickness of the concentration boundary layer is thick. Although a concentration boundary layer distribution exists, a film formation rate can be uniformed.

The reason will be described below.

Figure 20:
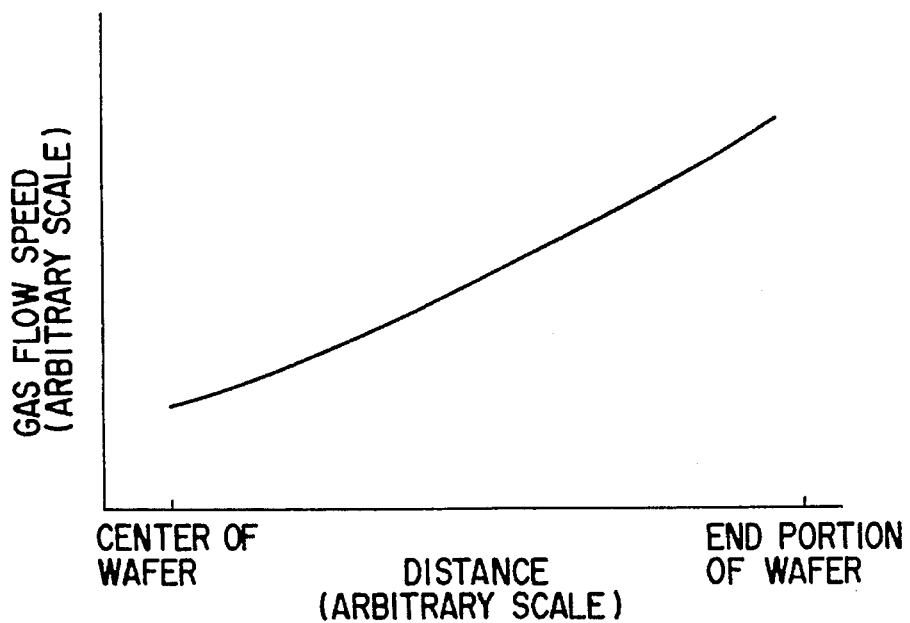
FIG. 20 is a graph showing a distribution of the flow rate of a gas when the processing gas is supplied from a shower head onto a semiconductor wafer.

In the sheet processing CVD apparatus 100, when a predetermined processing gas, e.g., $SiH_4$ is supplied into the processing chamber 105 through holes 104 formed in the multihole plate 103 on the bottom surface of the shower head 102 at a uniform flow rate, the processing gas flows in directions indicated by arrows. A flow speed u of the processing gas on the semiconductor wafer W becomes a function of a radius r of the wafer, and a distribution in which the flow speed becomes higher toward the peripheral portion as shown in FIG. 20 is represented. A thickness $\delta$ of the concentration boundary layer of a processing gas having a strong relationship with the moving amount of a film formation material is a function of the flow speed $\delta$ of the processing gas. The distribution of the thickness of this concentration boundary layer with respect to the semiconductor wafer W becomes thick at the central portion, and becomes thin toward the end portion. Consequently, the temperature becomes higher from the central portion to the end portion. Therefore, the peripheral region 128 of the semiconductor wafer in which the thickness of the concentration boundary layer of the processing gas is thin is set at a lower temperature than that of the central region 126 of the semiconductor wafer in which the thickness of the concentration boundary layer is thick, thereby making it possible to uniformly perform film formation.

A load lock chamber 52 is provided to the side of the processing chamber 105 through a gate valve 51 in the same manner as the apparatus in the first embodiment.

The operation of the CVD apparatus arranged in this manner will be described. The semiconductor wafer is loaded from a cassette housing chamber into the load lock chamber 52, and further loaded from the load lock chamber 52 into the processing chamber 105 in the same manner as in the first embodiment. The semiconductor wafer W is mounted on the mounting table 109 in the processing chamber 105, and chucked and held by the mounting surface of the mounting table 109 by a fixing means (not shown), e.g., an electrostatic chuck.

Thereafter, the first, second, and third heating members 116, 117, and 118 are independently controlled on the basis of control signals from the controller 119. The heating regions 123, 124, and 125 are heated to desired temperatures, e.g., 500° C., 450° C., and 400° C., respectively. As a result, by heat transfer from the regions 123, 124, and 125 on the mounting surface, the regions 126, 127, and 128, corresponding to these regions, on the reactive surface of the semiconductor wafer W are heated to desired temperatures, e.g., 500° C., 450° C., and 400° C., respectively.

A predetermined processing gas, e.g., a gas mixture of $SiH_4$ and $H_2$ is supplied from the processing gas source 107 into the shower head 102 through the massflow controller 108 and the processing gas feed pipe 106. In addition, the processing gas is supplied into the processing chamber 105 through the discharge holes 104 in the lower surface of the shower head 102, thereby performing a film formation process with respect to the surface of the semiconductor wafer W mounted on the mounting table 109.

At this time, in a conventional apparatus, a processing gas is supplied from the discharge holes 104 in the lower surface of the shower head 102 into the processing chamber 105 at a uniform flow speed. As described above, however, since the flow speed of the processing gas has a distribution shown in FIG. 20 with respect to the surface of the wafer, and the thickness of the concentration boundary layer of the gas has a distribution shown in FIG. 21, a uniform film formation rate cannot always be obtained on the surface of the target object by supplying the gas at a uniform flow speed.

According to the mounting table 109 having the above arrangement, however, since the regions 123, 124, and 125 on the surface of the mounting table 109 can be independently controlled to predetermined temperatures as shown in FIG. 19, the temperature of the surface to be processed of the semiconductor wafer W chucked and held by the mounting surface can be controlled as all the regions 126, 127, and 128 corresponding to the respective regions on the mounting surface. For this reason, the peripheral portion of the wafer is set to a lower temperature than that of the center thereof so as to cancel the distribution of the concentration boundary layer. Consequently, film formation can be performed at a uniform film formation rate on the surface of the wafer, and a uniform thin film having high quality can be obtained.

As described above, after a residual gas in the processing chamber 105 is exhausted by the exhaust means 110, the semiconductor wafer W on which film formation is completed is unloaded to the load lock chamber 52, and then unloaded to the cassette housing chamber. The series of processes are completed in this manner.

FIG. 22 is a sectional view showing a modification of a mounting table in the apparatus shown in FIG. 18.

In this embodiment, as shown in FIG. 22, a fourth heating member 135 is arranged to surround the semiconductor safer W as a target object. The fourth heating member 135 is independently controlled in addition to the first, second, and third heating members 116, 117, and 118 by controlling to turn on/off a switch 136 using a control signal supplied from the controller 119 in response to a signal from a fourth temperature sensor 155 provided in correspondence with the fourth heating member 135.

With this arrangement, the number of parameters for controlling the temperature distribution of the surface on the semiconductor safer W can be increased, thereby improving a control precision. In addition, particularly when the temperature of the semiconductor wafer W is increased from room temperature to a process temperature, e.g., 500° C., heating is rapidly effectively performed by the fourth heating member 135 arranged around the safer W.

The fourth embodiment will be described below.

Figure 23:
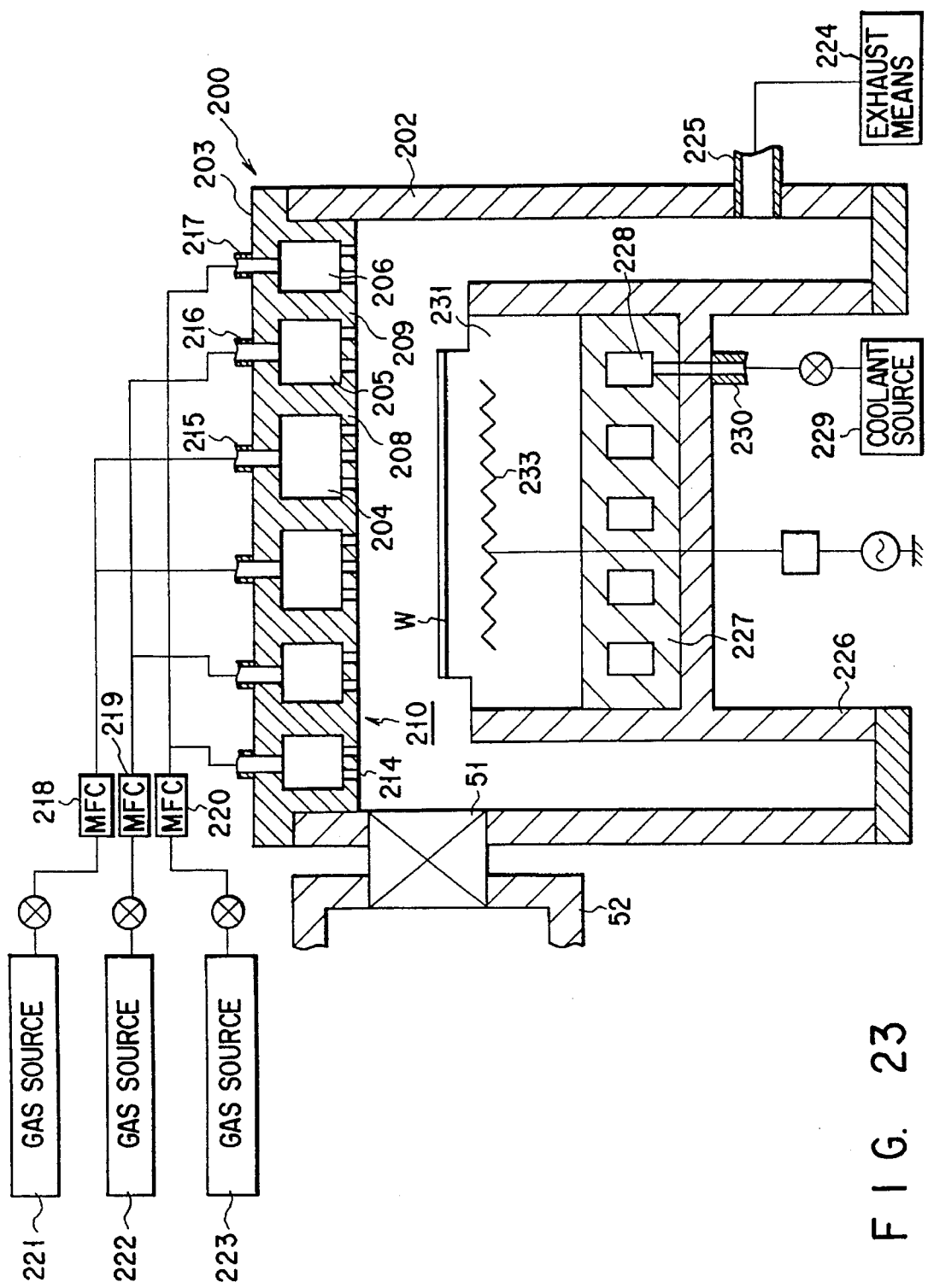
FIG. 23 is a sectional view illustrating a CVD apparatus according to the fourth embodiment of the present invention.

FIG. 23 is a sectional view showing a one-by-one type CVD apparatus according to this embodiment. This CVD apparatus 200 has a substantially cylindrical air-tight processing chamber 202, and a mounting table 231 for mounting a semiconductor safer W as a target object is provided therein.

A shower head 203 as a characteristic member in this embodiment is airtightly provided to the upper surface of the processing chamber 202. This shower head 203 has a disk-like shape, and three annular spaces 204, 205, and 206 are concentrically formed therein. These annular spaces 204, 205, and 206 are isolated by partitioning walls 208 and 209.

Figure 24:
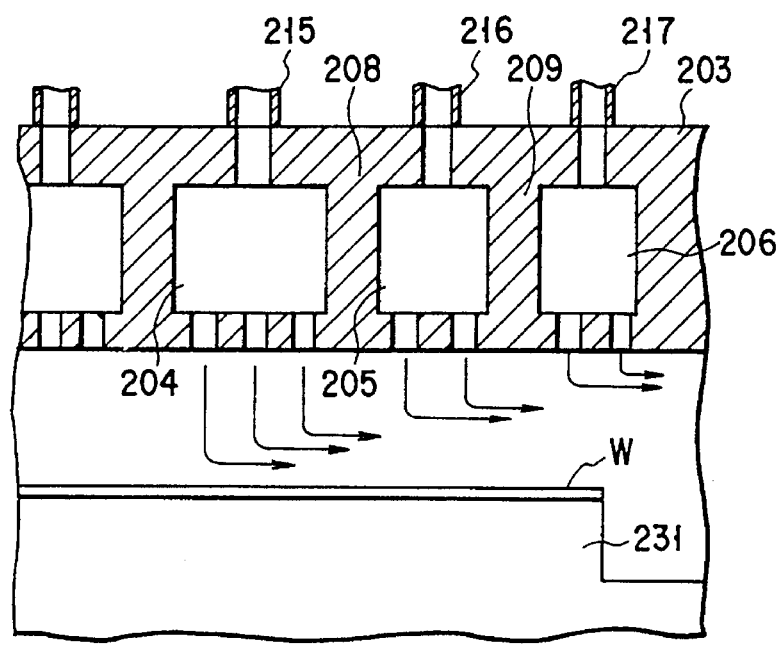
FIG. 24 is an enlarged sectional view showing a shower head in FIG. 23.

These annular spaces 204, 205, and 206 enlarged in FIG. 24 are constituted such that the widths of the spaces become narrower toward the radial direction so as to set the respective horizontal sectional areas equal to each other. With this arrangement, the flow rate of a processing gas supplied from the respective annular spaces into the processing chamber 202 can be easily grasped, thereby easily controlling the processing gas.

Figure 25:
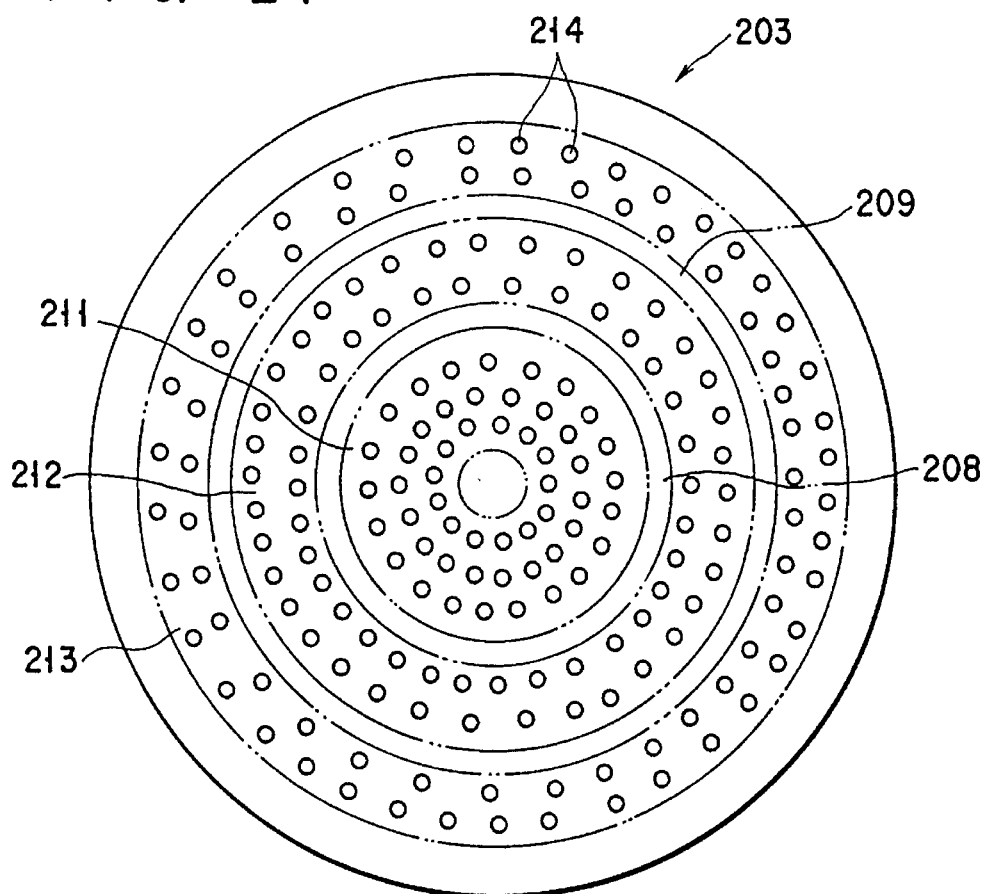
FIG. 25 is a bottom view showing the shower head in FIG. 23.

A processing gas discharge surface 210 of the shower head 203 is divided into three regions 211, 212, and 213 having the same areas corresponding to the annular spaces. A plurality of holes 214 are formed in this discharge surface 210 as shown in FIG. 25. The holes 214 are formed such that the opening degrees of the holes in the respective regions 211, 212, and 213 (a ratio of the total area of the holes formed in each region with respect to the area of the corresponding region) become equal to each other. With this arrangement, the flow rate of a processing gas supplied into the processing chamber 202 can be easily grasped, thereby further easily controlling the processing gas.

Processing gas feed pipes 215, 216, and 217 respectively corresponding to the annular spaces 204, 205, and 206 are connected to the upper portion of the shower head 203 having the above arrangement. These processing gas feed pipes 215, 216, and 217 communicate with corresponding processing gas sources 221, 222, and 223 through corresponding mass-flow controllers 218, 219, and 220. The processing gas feed pipes 215, 216, and 217 can independently supply a processing gas having desired compositions to the annular spaces 204, 205, and 206 at desired flow rates in response to control signals from a controller 250.

As described in the third embodiment, the flow rate (flow speed) of a processing gas on the semiconductor wafer W increases toward the peripheral portion, and the degree of increase becomes typical as the diameter of the shower head becomes smaller as shown in FIG. 26. In addition, a concentration boundary layer of a processing gas becomes thick at the central portion of the wafer, and becomes thinner toward the end portion.

In this embodiment, as described above, a processing gas can be supplied into the processing chamber 202 so as to cancel the distributions of the flow rate and the concentration boundary layer of the processing gas. For this reason, a film formation rate, uniformity of film formation, and film quality can be suitably controlled in accordance with a process circumstance.

An exhaust pipe 225 communicating with an exhaust means 224 such as a vacuum pump is provided near the bottom portion of the processing chamber 202. The processing chamber 202 can be evacuated to a predetermined vacuum degree by the operation of the exhaust means 224.

The bottom portion of the processing chamber 202 is constituted by a bottom plate 227 supported by a substantially cylindrical support member 226. A cooling water reservoir 228 is provided in the bottom plate 227. Cooling water is supplied from a coolant source 229 in the cooling water reservoir 228 through a pipe 230, and cooling water in the cooling water reservoir 228 is exhausted from an exhaust pipe (not shown). Cooling water circulates in the cooling reservoir 228.

The above mounting table 231 is set on the upper surface of the bottom plate 227. The semiconductor wafer can be mounted and fixed on the mounting surface of the mounting table 231 by a fixing means (not shown), e.g., an electrostatic chuck.

A heating member 233 which can be turned on/off by a switch 232 is incorporated in the mounting table 231. In a process, heat generated from this heating member 233 is supplied to the semiconductor safer W from the lower surface thereof by heat transfer to heat the semiconductor safer W to a desired temperature.

In this embodiment, a load lock chamber 52 is provided to the side of the processing chamber 202 in the same manner as in the above embodiments.

The operation of the CVD apparatus arranged in this manner will be described. The semiconductor wafer is loaded from a cassette housing chamber into the load lock chamber 52, and then loaded from the load lock chamber 52 into the processing chamber 202 in the same manner as in the first embodiment. The semiconductor wafer W is mounted on the mounting table 231 in the processing chamber 202, and chucked and held by the mounting surface of the mounting table 231 by a fixing means (not shown), e.g., an electrostatic chuck.

Thereafter, the semiconductor wafer W is heated to a predetermined temperature, e.g., 500° C. A predetermined processing gas, e.g., a gas mixture of $SiH_4$ and $H_2$ is supplied from the processing gas sources 221, 222, and 223 into the annular spaces 204, 205, and 206 in the shower head 203 through the mass-flow controllers 218, 219, and 220 and the processing gas feed pipes 215, 216, and 217. In addition, the processing gas is supplied into the processing chamber 202 through the holes 214 formed in the regions 211, 212, and 213 on the gas discharge surface corresponding to the respective annular spaces 204, 205, and 206, thereby performing a film formation process with respect to the surface of the semiconductor wafer W mounted on the mounting table 231.

At this time, since the compositions and flow rates of a processing gas supplied into the annular spaces 204, 205, and 206 can be independently controlled in the shower head 203 arranged in the above manner, the processing gas can be supplied so as to cancel the distributions of a gas flow rate and a concentration boundary layer. As a result, uniform film formation having high quality can be performed with respect to the semiconductor wafer W at a desired film formation rate.

In the above embodiment, the same kind of processing gas, e.g., a gas mixture of $SiH_4$ and $H_2$ is supplied into the respective annular spaces. The present invention, however, is not limited to this embodiment, and different kinds of gases may be supplied into the annular spaces 204, 205, and 206 to mix the respective gases in the processing chamber 202

In processing the semiconductor wafer W having a small diameter, since the annular spaces 204, 205, and 206 are concentrically arranged, supply of a processing gas into, e.g., the outermost annular space 206 is stopped so that the shower head itself need not be replaced in accordance with an outer diameter of the semiconductor safer W to be processed. In this case, the annular space 206 itself is preferably constituted to be capable of isolating from the processing chamber 2 so as not to reversely flow a processing gas from the processing chamber 202 through the holes 214 formed in the region 213 in the gas blow surface corresponding to the annular space 206 during the process.

As described above, after a residual gas in the processing chamber 202 is exhausted by the exhaust means 224, the semiconductor wafer W on which film formation is completed is unloaded to the load lock chamber 52, and then unloaded to the cassette housing chamber. The series of processes are completed in this manner.

FIG. 27 shows another example of the shower head 203. In this embodiment, as shown in FIG. 27, baffle plates 240 and 241 are provided in two layers in the annular spaces 204, 205, and 206, respectively. A processing gas supplied from the respective processing gas feed pipes 215, 216, and 217 into the respective annular spaces 204, 205, and 206 is straightened. With this arrangement, the processing gas supplied from the regions 211, 212, and 213 on the blow surface corresponding to the annular spaces 204, 205, and 206 is straightened, thereby increasing the control precision of a gas supply amount. As the baffle plate 241 capable of being used in the embodiment shown in FIG. 27, a plate material in which a plurality of holes are formed, or a braided wire material in a meshed shape can be used.

The fifth embodiment will be described below.

This embodiment is characterized by a power supply portion for supplying power to a power reception member, e.g., a heater or an electrostatic chuck, which is powered in a vacuum in a vacuum processing apparatus such as a CVD apparatus.

Figure 28:
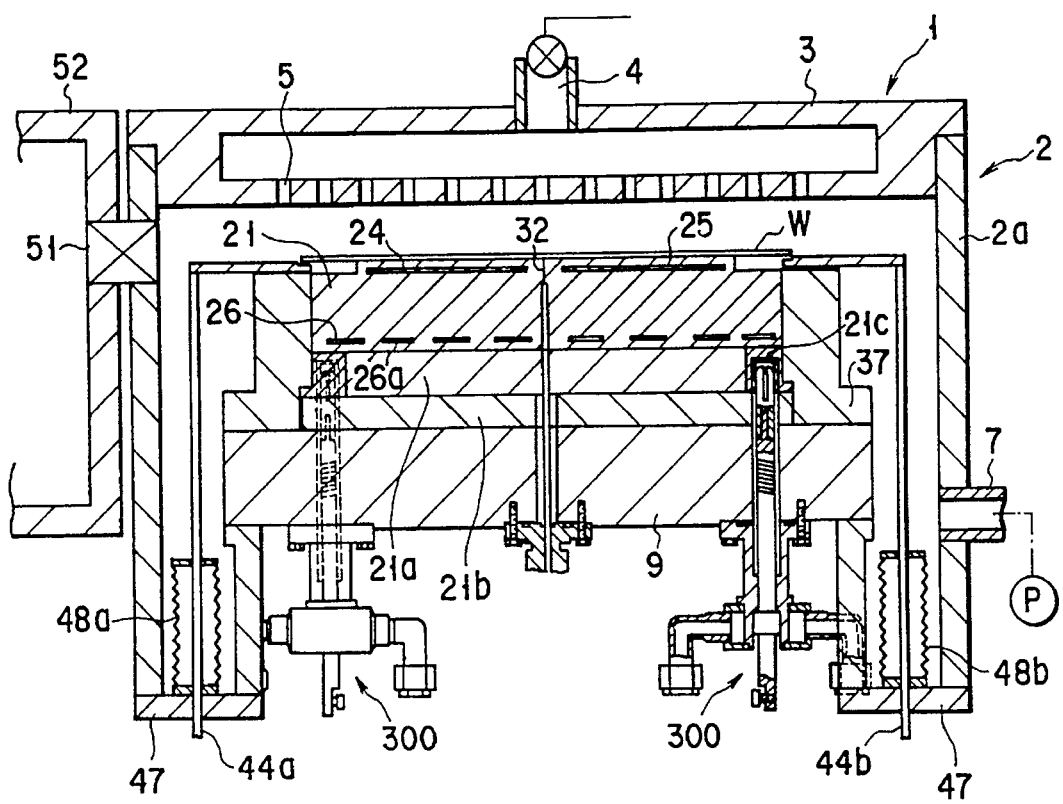
FIG. 28 is a sectional view showing a CVD apparatus according to the fifth embodiment of the present invention.

FIG. 28 is a sectional view shown a CVD apparatus according to this embodiment. This apparatus has the same basic structure as that in the first embodiment. The same reference numerals as in the first embodiment denote the same parts in this embodiment, and a detailed description thereof will be omitted.

In this embodiment, a mounting table 21 for mounting a semiconductor safer W is mounted on a bottom plate 9 through support members 21a and 21b. A cylindrical support member 21c made of, e.g., BN is arranged together with the mounting table 21 at a portion corresponding to the peripheral edge portion of the mounting table 21 under the mounting table 21.

Figure 29:
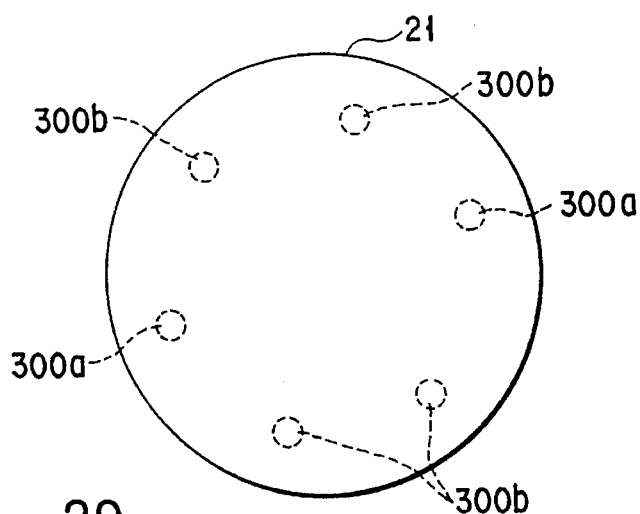
FIG. 29 is a view showing positions of power supply portions mounted on a mounting table in FIG. 28.

Power reception portions such as conductive members 24 and 25 for an electrostatic chuck, a heater 26, and the like are provided in the mounting table 21 in the same manner as the apparatus in the first embodiment. Power supply portions 300a and 300b for supplying power to these power reception portions are provided between these members and power supplies for them. In this embodiment, the power supply portions having the same arrangements are used for the conductive members 24 and 25, and the heater 26. As shown FIG. 29, the power supply portions 300a for supplying power to the conductive members 24 and 25 for the electrostatic chuck, and the power supply portions 300b for supplying power to the heater 26 are arranged along the circumferential direction of the mounting table 21.

Figure 30:
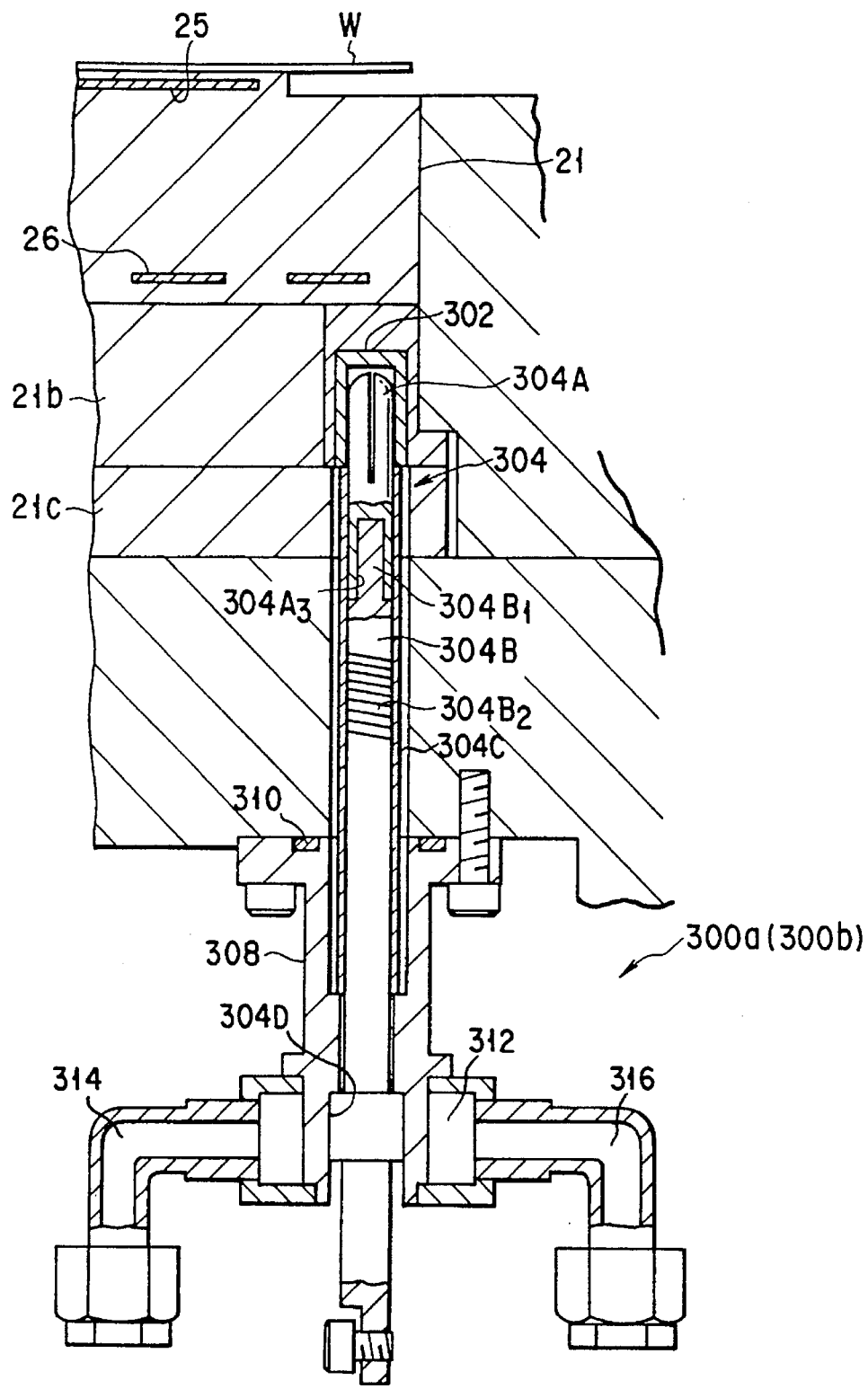
FIG. 30 is an enlarged sectional view showing the power supply portions in FIG. 28.

FIG. 30 is a sectional view showing one of the power supply portions 300a (300b) in detail. This power supply portion comprises a receptacle terminal 302 provided at the mounting table 21 side, and a plug terminal 304 capable of fitting in the receptacle terminal 302, and these terminals constitute the main portion. The receptacle terminal 302 is constituted by a cap-like member having a downward opening which is one of openings each with a bottom, and the receptacle terminal 302 is buried in the bottom portion of the support member 21c provided together with the mounting table 21.

A surface treatment is performed on this receptacle terminal 302. This surface treatment will be described with reference to FIGS. 31A to 31C. In a stage wherein the receptacle terminal 302 is buried in the support member 21c, a step portion which has a smaller inner diameter, around the inner bottom of the receptacle terminal 302, than that of the downward opening is formed as shown in FIG. 30A.

First, a carbon layer 302A as a conductive layer is coated on the receptacle terminal 302 having such a shape using a CVD process. This carbon layer 302A is not only coated on the receptacle terminal 302, but also extends from the position of this terminal 302 toward electrode portions 24 and 25, or a heater 26, thereby constituting a wiring portion between respective conductive members. The upper surface of this carbon layer 302A is coated with, e.g., P—BN (pyrolytic boron nitride) using a CVD process to form an insulating layer 302B, resulting in a state shown in FIG. 31B.

Since such a surface treatment is the same process as that for the second insulating layer formed on the surface of the mounting table 21 described in the first embodiment, this surface treatment can be performed at the same time of the process for the mounting table 21 side by burying the receptacle terminal 302 in a stage of forming the mounting table 21.

As show in FIG. 31C, in the receptacle terminal 302 on which the insulating layer 302B is formed, the insulating layer 302B is removed by cutting the inner circumferential surface of the step portion positioned around the inner bottom portion using machining, and the carbon conductive layer is exposed. The position is set as a contact 302C with the plug terminal 304.

More specifically, the conductive portion of the receptacle terminal 302 is formed only at the deep side near the inner bottom. In this embodiment, the inner diameter of the insulating layer 302B is substantially the same as that of the contact 302C by cutting the side surface around the inner bottom portion.

In using such a side surface as the contact, when thermal expansion occurs at the plug terminal side, and the plug terminal 304 is axially expanded and deformed, the contact of the receptacle terminal 302 with the plug terminal 304 can be kept. Instead of forming the contact 302C by removing the insulating layer 302B, the step portion can be exposed in advance, and positions except for a position corresponding to the contact 302C can be coated.

As shown in FIG. 32, a conductive layer 302D is formed on a recessed portion, into which the receptacle terminal 302 is inserted, of the support member 21c, and the outside of the support member 21c. A threaded portion is formed on the vertical portion inside the recessed portion of the conductive layer 302D. A conductive cap 302E made of carbon or the like and an insulating cap 302F made of, e.g., BN are threadably engaged with this threaded portion. The conductive cap 302E and the insulating cap 302F constitute the receptacle terminal 302. The insulating layer 302B made of P—BN or the like is formed except for the conductive cap 302E in the same manner as in FIG. 31B. In this case, the contact 302C is formed on the inner side portion of the conductive cap 302E.

On the other hand, the plug terminal 304 comprises a conductive portion 304A and a support member 304B. For example, the conductive portion 304A has an outer diameter slightly larger than the inner diameter of the contact 302C of the receptacle terminal 302. The conductive portion 304A is formed of tungsten which can keep an elastic force at a certain degree even in a high-temperature atmosphere. As shown in FIG. 33, a plurality of slits $304A_1$ are axially formed from the head portion of the conductive portion 304A. The end of each slit $304A_1$ is positioned below the bottom portion of the support member 21c. For this reason, when the plug terminal 304 is forced into the receptacle terminal 302, the plug terminal 304 can tightly contact between the contact 302C and the insulating layer 302B extending to the downward opening of the receptacle terminal 302 using a restoring force in flexible deformation.

In addition, since the slits $304A_1$ extend below the support member 21c, the pressure of the receptacle terminal 302 can be balanced with the pressure of the outside of the receptacle terminal, thereby eliminating an extra resistance in forcing.

The plug terminal 304 forced into the receptacle terminal 302 has a narrow gap l between the head portion of the conductive portion 304A and the inner bottom portion of the receptacle terminal 302 as shown in FIG. 31C. With this gap, thermal expansion occurring at the support member 304B (to be described later) can be absorbed. Since the conductive portion 304A of the plug terminal 304 is to obtain contact characteristics using a size difference between the conductive portion 304A and the receptacle terminal 302, the conductive portion 304A on which the half portion between the slits expand outward in advance may be applied.

In the conductive portion 304A of FIG. 33, an insulating layer is formed on the surface thereof except for a position $304A_2$ contacting the contact 302C of the receptacle terminal 302 by a CVD process using, e.g., SiC, or $SiO_2$. With this arrangement, discharge can be prevented between the plug terminals adjacent to each other.

On the other hand, the support member 304B is a member for fixing the conductive portion 304A. In this embodiment, the support member 304B is made of Kovar of a nickel alloy. The support member 304B is covered with a ceramic pipe 304C. A columnar projection $304B_1$ is formed at the distal end of the support member 304B, i.e., the end portion opposing the conductive portion 304A as shown in FIG. 33. This projection $304B_1$ is tightly fitted into a hole $304A_3$ formed in the bottom portion of the conductive portion 304A to integrate the support member 304B with the conductive portion 304A. By performing such tight fit, when a temperature at the distal end side near the heater side increases, and thermal expansion occurs at the projection $304B_1$, a stronger connected state can be obtained.

The lower end of the support member 304B is set as a wiring connection portion, and the intermediate portion of the support member 304B is fixed by the bottom plate 9. A ceramic support member 308 is mounted on the lower surface of the bottom plate 9. The support member 304B is fixed to the inner surface of the lower portion of the support member 308 by brazing. The support member 308 is formed of a ceramic material to insulate the support member 304B from the outside and in addition, to prevent a brazed portion 304D from being peeled because a thermal expansion coefficient of the ceramic is almost equal to that of Kovar used for the support member 304B. An O-ring 310 is arranged between the opposite surfaces of the bottom plate 9 and the support member 308.

A notched portion $304B_2$ whose body itself is spirally formed is formed on the intermediate portion of the support member 304B in an axial direction. When the axis of the conductive portion 304A is shifted from that of the brazed support member 304B, the conductive portion 304A can be matched with the receptacle terminal 302 by this notched portion $304B_2$.

In the support member 304B, an insulating layer is formed from the distal end thereof to a position opposing a cooling portion (to be described later), in other words, on the surface within the range of contacting a reduced-pressure atmosphere by a CVD process using $SiO_2$ or SiN in the same manner as the conductive portion 304A. The presence of this insulating film prevents the metal portion from being exposed. Therefore, discharge from the conductive member can be prevented at a portion positioning in a reduced-pressure atmosphere.

On the other hand, a cooling structure is provided around the brazed portion 304D in the support member 304B. That is, such a cooling structure is provided to avoid thermal peeling at the brazed portion 304D and a danger that the support member 304B positioned in the outer atmosphere may be exposed to a high temperature. For this reason, a water cooling jacket 312 is provided along a circumferential direction at a position opposing the brazed portion 304D through the support member 308. A supply pipe 314 and a drainage pipe 316 for circulating cooling water are connected this water cooling jacket 312. In this case, the temperature of the brazed portion 304D is kept at, e.g., about 500° C. by this cooling structure. Such a cooling structure can effectively suppress damage to the brazed portion caused by an increase in temperature in the plug terminal 304 in which a large current is required to flow to the power supply portion for a heater.

An operation will be described below.

The power supply portions for the electrode portions 24 and 25 of the electrostatic chuck of the mounting table 21, and the power supply portions for the heater are incorporated in a processing chamber 2 in the manufacturing process. That is, when the power supply portions are to be incorporated, the receptacle terminals 302 are buried in the mounting table 21 side. The surface treatment is to be performed with respect to the receptacle terminals 302. In this surface treatment, when each carbon layer 302A constituting the conductive layer is formed using a CVD process, a portion corresponding to the portion 300a (see FIG. 29) for supplying power to the electrode portions 24 and 25 of the electrostatic chuck, and a portion corresponding to the portion 300b (see FIG. 29) for supplying power to the heater 26 are simultaneously processed in each receptacle terminal 302. These portions are formed as wiring portions at once in coating or subsequent patterning. These wirings are represented as a wiring toward the electrodes 24 and 25 by a chain line, and a wiring toward the heater 26 by a chain double-dashed line in FIG. 30. In FIG. 30, for the descriptive convenience, both the wirings are drawn from the same receptacle terminal 302. However, these wirings are actually drawn from the receptacle terminals 302 corresponding to the above power supply portions.

when the carbon layers 302A are formed in this manner, P—BN (pyrolyric boron nitride) is coated on these layers using a CVD process to form the insulating layers 302B. In this surface treatment, insulating layers at the electrostatic chuck side can be formed at once in the same manner as wirings between the above carbon layers 302A, and the electrode portions 24 and 25 of the electrostatic chuck or the heater 26. The inner circumferential surfaces near the inner bottom portions of the receptacle terminals 302 are cut using machining to remove the insulating layers 302B, thereby forming the contacts 302C.

On the other hand, in incorporating each plug terminal 304 into the corresponding receptacle terminal 302, the conductive portion 304A integrated with the support member 304B brazed to the support member 308 by being tightly fitted to the distal end of the support member 304B is inserted into the receptacle terminal 302. At this time, the conductive portion 304A is inserted in a direction wherein a diameter decreases while flexing by a size difference between the receptacle terminal 302 and the conductive portion 304A. That is, the conductive portion 304A is, so-called, forced into a position where a proper gap (gap represented by the reference symbol 1 in FIG. 31C) is provided between the distal end of the conductive portion 304A and the inner bottom portion of the receptacle terminal 302.

Each conductive portion 304A causes a force in restoring flexing deformation to act within the range of the contact 302C of the receptacle terminal 302 to the opening thereof. For this reason, the gap between the inner surface of each receptacle terminal 302 and the outer surface of each plug terminal 304 becomes very small. Therefore, since collision rate of electrons discharged from the contact 302C are limited in the gap, and a state in which so-called mean free path cannot be almost obtained is set, an electron avalanche phenomenon cannot be generated. With this operation, the discharge phenomenon can be prevented.

If the axis of each conductive portion 304A inserted under pressure into the receptacle terminal 302 does not coincide with the axis of each support member 304B, the plug terminal 304 inserted under pressure into the receptacle terminal 302 makes the conductive portion 304A match with the position of the receptacle terminal 302 through the spiral notched portion 304B$_2$ in a state wherein the axes are slightly shifted from each other in a certain degree. For this reason, even if an assembly error occurs between the mounting table 21 side and the bottom plate 9 side, each conductive portion 304A can be matched with the position of the corresponding receptacle terminal 302 and inserted under pressure.

When the forcing of the plug terminals 304 into the receptacle terminals 302 is ended, the support members 308 are fixed to the bottom plate 9, thereby ending the incorporation.

On the other hand, power supply is performed from the plug terminals 304 inserted under pressure into the receptacle terminals 302 to the electrodes 24 and 25 for the electrostatic chuck, and the heater 26. In this case, power supply is performed from the contacts 302C of the receptacle terminals 302 to the respective electrodes 24 and 25, and the heater 26 through the wirings by the carbon layers 302A.

According to this embodiment, a plug terminal used when power supply is performed from a high-voltage power supply, and a plug terminal used when a large amount of current is supplied have a common structure. For this reason, when the contents of power supply are different from each other, a terminal fitting to the content need not be prepared to simplify the structure.

In addition, since the assemble procedure by which the receptacle terminal side is inserted into the plug terminal is applied, the power supply portion can be assembled by an easy operation that the receptacle terminal side is only mounted from the above, thereby realizing easy maintenance.

According to this embodiment, each of the receptacle terminals has a structure in which the opening with a bottom is formed to each power reception member for the heater or the like, the bottom portion side of the receptacle terminal is set as the conductive contact, and the insulating layer is formed at the opening end side. Since these receptacle terminals are applied, and the plug terminals are inserted into the corresponding receptacle terminals to supply power, collision rate of electrons at the contacts can be reduced with a simple structure. For this reason, since the electron avalanche phenomenon caused by electrons discharging from the contacts can be prevented, discharge can be prevented even if wiring is performed in a vacuum.

Figure 34:
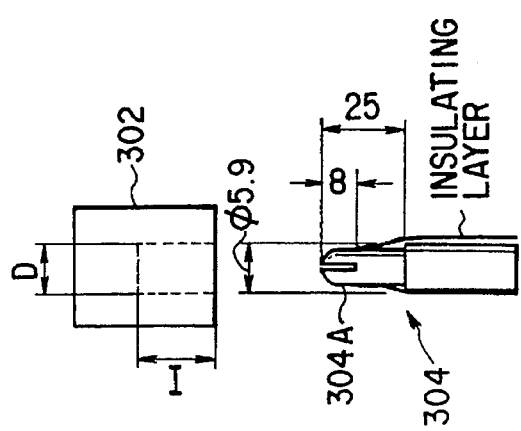
FIG. 34 is a graph showing a relationship between a vacuum degree and a discharge start voltage when the depth and diameter of an opening portion of the receptacle terminal are changed.
Figure 34:
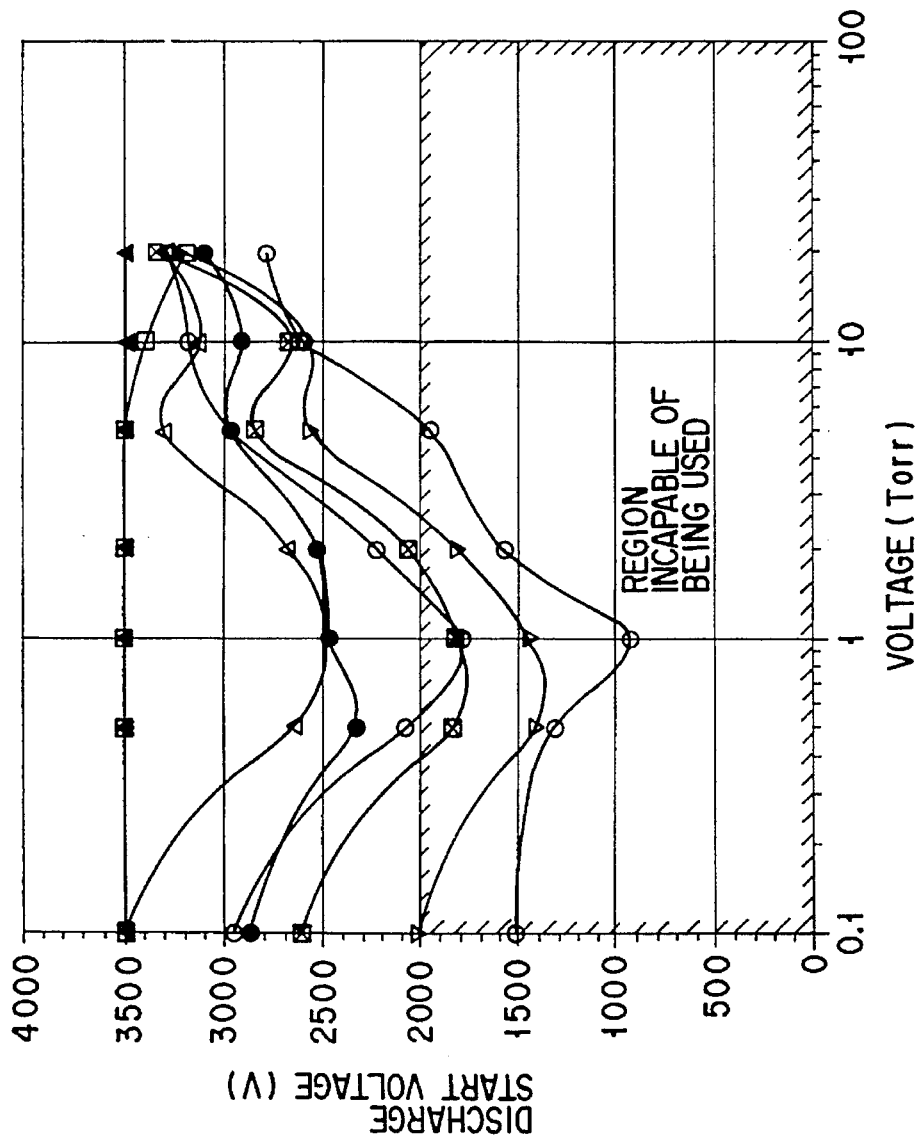

Such a discharge preventive effect varies in accordance with the shape of each of the receptacle terminals 302. This will be described on the basis of FIG. 34. FIG. 34 shows a relationship between a vacuum degree in the processing chamber and a discharge start voltage when a depth L and a diameter D of the cap opening portion of a Teflon receptacle terminal 302 are changed. The depth L of the opening portion was set to 16, 20, and 23 mm, and its diameter D was set to 6.0, 6.2, and 6.4 mm. The length of conductive portion 304A of the plug terminal 304 was set to 25 mm, its exposed length was set to 8 mm, and its diameter was set to 5.9 mm. A test was conducted at 25° C.

As is apparent from FIG. 34, as L was larger and D was smaller, i.e., the contact position was deeper and the width of the opening portion was smaller, the discharge start voltage was stably higher, i.e., discharge tended not to occur.

According to this embodiment, since the surface of each plug terminal except for the contact is coated with the insulating layer, discharge can be effectively prevented.

Furthermore, the conductive layer provided to each receptacle terminal can be coated in addition to the electrodes of the electrostatic chuck or the heater serving as the power reception portions. For this reason, in coating or subsequent patterning, the conductive layer of the receptacle terminal and the electrodes of the respective portions, or the insulating layers in the case of the electrostatic chuck can be formed at once. Therefore, since wiring can be performed in a reduced-pressure atmosphere without discharge, a specific cutoff structure is not required between an vacuum atmosphere and the outer atmosphere, thereby simplifying the structure. As a result, a wiring cost can be reduced.

In this embodiment, if the plug terminal does not so thermally expand, and the contact state does not change, the contact in each receptacle terminal can be formed not only on the side surface around the inner bottom portion, but also, e.g., on the bottom surface of the receptacle terminal. In this case, the distal end of each plug terminal may contact the bottom surface of the receptacle terminal with being biased against the bottom surface of the receptacle terminal.

Still further, in this embodiment, each receptacle terminal has a shape comprising only the opening with a bottom. For this reason, not only the cap is used as in the above embodiment, but also a recessed portion for forming an opening with a bottom may be provided in the mounting table as, e.g., opposing electrodes in a plasma etching apparatus when the mounting table is a conductive member. In this case, the bottom portion of the opening with a bottom serves as a contact, an insulating layer is formed at the opening end side of the opening with a bottom, thereby obtaining the same function as in the above embodiment.

The thermal CVD apparatus has been exemplified in each embodiment described above. The present invention, however, is not limited to this apparatus, and may be applied to plasma CVD apparatus and to other vacuum processing apparatuses, e.g., an etching apparatus, an ashing apparatus, and a sputtering apparatus.

Figure 35:
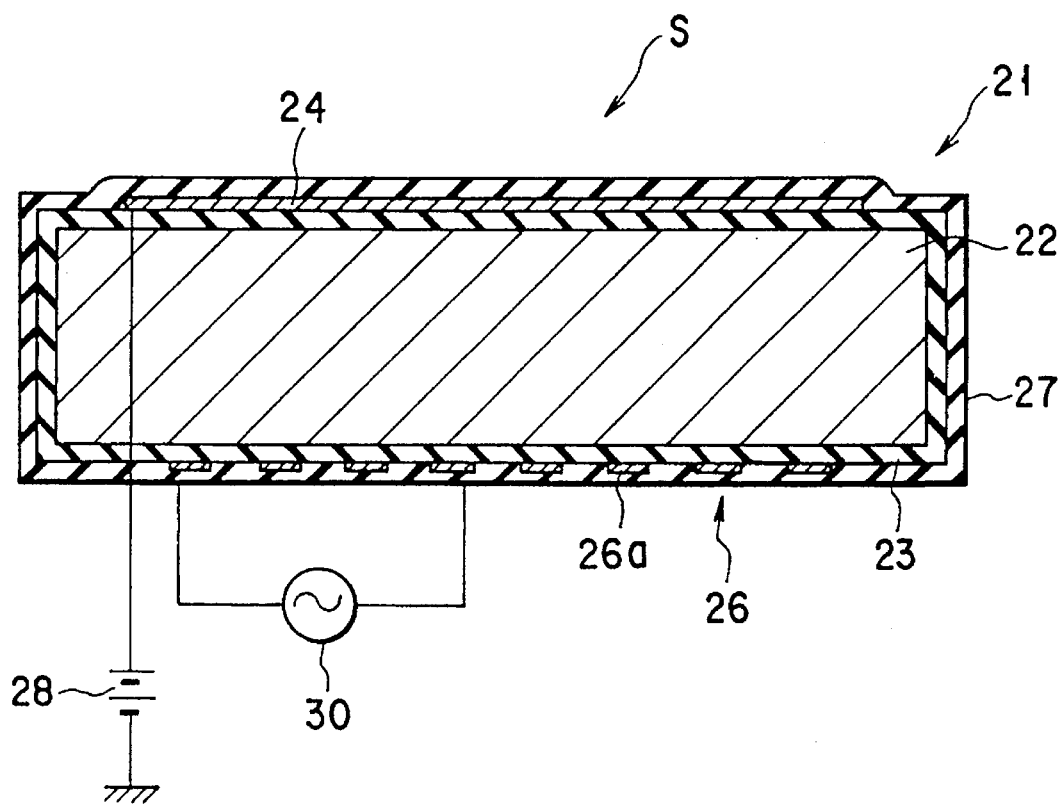
FIG. 35 is a sectional view showing a mounting table on which a unipolar type electrostatic chuck.

A bipolar type electrostatic chuck using two conductive members as the electrodes is used as the electrostatic chuck. As shown in FIG. 35, a unipolar type electrostatic chuck using only one conductive member 24 as the electrode may be used.

An apparatus, shown in FIG. 36, having both a function of divisionally heating a target object by the mounting table according to the third embodiment, and a function of divisionally controlling the flow rate of a processing gas by the shower head according to the fourth embodiment can be constituted. In this case, parameters to be controlled can be increased, thereby further increasing uniformity in film formation.

Furthermore, a target object is not limited to the semiconductor wafer, and may be, e.g., an LCD substrate.

Still further, various changes and modifications may be effected without departing from the spirit and scope of the invention.

What is claimed is:

1. A vacuum processing apparatus comprising:
    a processing chamber for processing a target object in a vacuum;
    a mounting member provided in said processing chamber and having a mounting surface for mounting said target object;
    electrostatic chuck means, provided to said mounting surface of said mounting member, for chucking said target object;
    heating means for heating said target object; and
    processing gas supply means for supplying a processing gas for processing said target object into said processing chamber,
    wherein said mounting member has a base, a first insulating layer formed on a surface of said base, and a second insulating layer formed on said first insulating layer, and has a conductive layer between said first insulating layer and said second insulating layer on a mounting surface side of said mounting member to obtain the electrostatic chuck means constituted by said first insulating layer, said second insulating layer, and said conductive layer, and
    the heating means has a heating member provided between said first insulating layer and said second insulating layer on a surface side opposing said mounting surface of said mounting member.

2. A vacuum processing apparatus according to claim 1, wherein said base of said mounting member contains boron nitride (BN) or carbon (C).

3. A vacuum processing apparatus according to claim 1, wherein said first and second insulating layers of said mounting member are chemical vapor deposition (CVD) films.

4. A vacuum processing apparatus according to claim 1, wherein said first insulating layer of said mounting member contains a material selected from pyrolytic boron nitride (P—BN), silicon oxide ($SiO_2$), aluminum nitride (AlN), alumina ($Al_2O_3$), and silicon nitride ($Si_3N_4$).

5. A vacuum processing apparatus according to claim 1, wherein said second insulating layer of said mounting member contains a material selected from pyrolytic boron nitride (P—BN), silicon oxide ($SiO_2$), aluminum nitride (AlN), alumina ($Al_2O_3$), and silicon nitride ($Si_3N_4$).

6. A vacuum processing apparatus comprising:
    a processing chamber for processing a target object in a vacuum;
    a mounting member provided in said processing chamber and having a mounting surface for mounting said target object;
    electrostatic chuck means, provided to said mounting surface of said mounting member, for chucking said target object;
    heating means for heating said target object; and
    processing gas supply means for supplying a processing gas for processing said target object into said processing chamber,
    wherein said mounting member has an insulating base and an insulating layer formed on a surface of said base, and has a conductive layer between said base and said insulating layer on a mounting surface side of said mounting member to obtain the electrostatic chuck means constituted by said base, said insulating layer, and said conductive layer, and
    the heating means has a heating member provided between said base and said insulating layer on a surface side opposing said mounting surface of said mounting member.

7. A vacuum processing apparatus according to claim 6, wherein said insulating base of said mounting member contains boron nitride (BN).

8. A vacuum processing apparatus according to claim 6, wherein first and second insulating layers of said mounting member are chemical vapor deposition (CVD) films.

9. A vacuum processing apparatus according to claim 6, wherein said insulating layer of said mounting member contains a material selected from pyrolytic boron nitride (P—BN), silicon oxide ($SiO_2$), aluminum nitride (AlN), alumina ($Al_2O_3$), and silicon nitride ($Si_3N_4$).

10. A mounting table having an electrostatic chuck function and a heating function, comprising:
    a mounting member having a mounting surface for mounting a target object;
    electrostatic chuck means, provided to said mounting surface of said mounting member, for chucking said target object; and
    heating means for heating said target object,
    wherein said mounting member has a base, a first insulating layer formed on a surface of said base, and a second insulating layer formed on said first insulating layer, and has a conductive layer between said first insulating layer and said second insulating layer on a mounting surface side of said mounting member to obtain the electrostatic chuck means constituted by said first insulating layer, said second insulating layer, and said conductive layer, and
    the heating means has a heating member provided between said first insulating layer and said second insulating layer on a surface side opposing said mounting surface of said mounting member.

11. A mounting table according to claim 10, wherein said base of said mounting member contains boron nitride (BN) or carbon (C).

12. A mounting table according to claim 10, wherein said first and second insulating layers of said mounting member are chemical vapor deposition (CVD) films.

13. A mounting table according to claim 10, wherein said first insulating layer of said mounting member contains a material selected from pyrolytic boron nitride (P—BN), silicon oxide ($SiO_2$), aluminum nitride (AlN), alumina ($Al_2O_3$), and silicon nitride ($Si_3N_4$).

14. A mounting table according to claim 10, wherein said second insulating layer of said mounting member contains a material selected from pyrolytic boron nitride (P—BN), silicon oxide ($SiO_2$), aluminum nitride (AlN), alumina ($Al_2O_3$), and silicon nitride ($Si_3N_4$).

15. A mounting table having an electrostatic chuck function and a heating function, comprising:
    a mounting member having a mounting surface for mounting a target object;

electrostatic chuck means, provided to said mounting surface of said mounting member, for chucking said target object; and heating means for heating said target object, wherein said mounting member has an insulating base and an insulating layer formed on a surface of said base, and has a conductive layer between said base and said insulating layer on a mounting surface side of said mounting member to obtain the electrostatic chuck means constituted by said base, said insulating layer, and said conductive layer, and the heating means has a heating member provided between said base and said insulating layer on a surface side opposing said mounting surface of said mounting member.

16. A mounting table according to claim 15, wherein said insulating base of said mounting member contains boron nitride (BN).

17. A mounting table according to claim 15, wherein first and second insulating layers of said mounting member are chemical vapor deposition (CVD) films.

18. A mounting table according to claim 15, wherein said insulating layer of said mounting member contains a material selected from pyrolytic boron nitride (P—BN), silicon oxide ($SiO_2$), aluminum nitride (AlN), alumina ($Al_2O_3$), and silicon nitride ($Si_3N_4$).

* * * * *

UNITED STATES PATENT AND TRADEMARK OFFICE
CERTIFICATE OF CORRECTION

PATENT NO. : 5,591,269
DATED : January 7, 1997
INVENTOR(S) : Junichi Arami et al.

It is certified that error appears in the above-identified patent and that said Letters Patent is hereby corrected as shown below:

<u>Title page,</u>
Item [73], should read as follows:
-- [73] Assignees: Tokyo Electron Limited; Tokyo Electron Tohoku Limited; Shin-Etsu Chemical Co., Ltd., all of Japan --

Signed and Sealed this

Twenty-sixth Day of August, 2003

JAMES E. ROGAN
*Director of the United States Patent and Trademark Office*